(12) United States Patent
Libsch et al.

(10) Patent No.: US 11,329,035 B2
(45) Date of Patent: May 10, 2022

(54) TETHERLESS CHIP MODULE

(71) Applicant: International Business Machines Corporation, Armonk, NY (US)

(72) Inventors: Frank Robert Libsch, White Plains, NY (US); Ghavam G. Shahidi, Pound Ridge, NY (US)

(73) Assignee: International Business Machines Corporation, Armonk, NY (US)

(*) Notice: Subject to any disclaimer, the term of this patent is extended or adjusted under 35 U.S.C. 154(b) by 73 days.

(21) Appl. No.: 16/850,907

(22) Filed: Apr. 16, 2020

(65) Prior Publication Data

US 2021/0327860 A1 Oct. 21, 2021

(51) Int. Cl.
*H01L 25/16* (2006.01)
*H01L 27/105* (2006.01)

(52) U.S. Cl.
CPC ............ *H01L 25/167* (2013.01); *H01L 25/16* (2013.01); *H01L 27/1052* (2013.01)

(58) Field of Classification Search
CPC .... H01L 25/16; H01L 25/167; H01L 27/1052
See application file for complete search history.

(56) References Cited

U.S. PATENT DOCUMENTS

| | | | |
|---|---|---|---|
| 6,853,559 B2 | 2/2005 | Panella et al. | |
| 8,114,304 B2 | 2/2012 | Leib et al. | |
| 8,258,536 B2 | 9/2012 | Chen | |
| 8,592,932 B2 | 11/2013 | Andry et al. | |
| 8,761,842 B2 | 6/2014 | Jacobs et al. | |
| 9,111,925 B2 | 8/2015 | Golgan et al. | |
| 9,935,088 B2 | 4/2018 | Budd et al. | |
| 10,090,286 B2 | 10/2018 | Budd et al. | |
| 2001/0011766 A1* | 8/2001 | Nishizawa | G06K 19/07 257/685 |
| 2007/0252263 A1* | 11/2007 | Jow | H01L 23/3128 257/690 |
| 2015/0137148 A1* | 5/2015 | Wong | H01L 25/167 257/82 |
| 2017/0092558 A1 | 3/2017 | Mittal et al. | |
| 2018/0114800 A1* | 4/2018 | Pan | H01L 25/0753 |
| 2021/0106278 A1* | 4/2021 | Quinn | A61B 5/01 |

FOREIGN PATENT DOCUMENTS

WO WO-2008031633 A1 * 3/2008 ......... H01L 23/5382

* cited by examiner

*Primary Examiner* — Allan R Wilson

(74) *Attorney, Agent, or Firm* — Daniel Morris; Otterstedt, Wallace & Kammer, LLP

(57) ABSTRACT

Attach a smart chip to a carrier, and attach a memory chip to the carrier in communication with the smart chip. The memory chip has a larger footprint than the smart chip, overlies the smart chip, and is attached to the carrier by connections around the periphery of the smart chip. Removably attach an energy storage device (ESD) to the carrier and electrically connect the ESD to the carrier via a flex bridge.

19 Claims, 19 Drawing Sheets

TETHERLESS CHIP MODULE

BACKGROUND

The present invention relates to the electrical, electronic, and computer arts, and more specifically, to packaging of integrated circuits.

Extremely low power smart electronic devices with integrated sensors can enable new data in applications where these devices are far from a tethered power supply, and cannot afford the larger footprint or the field serviceability of batteries, or the higher transmission power of sending the data when sensed. The device applications range from sensors and smart sensors in the field to Internet of Things (IoT) devices, and the like.

SUMMARY

Principles of the invention provide techniques for a tetherless chip module. In one aspect, an exemplary method includes attaching a smart chip to a carrier and attaching a memory chip to the carrier and connecting the memory chip in communication with the smart chip. The memory chip has a larger footprint than the smart chip, overlies the smart chip, and is attached to the carrier by connections around the periphery of the smart chip.

According to another aspect, an exemplary tetherless apparatus includes a carrier; a smart chip that is attached to the carrier; and a memory chip that is attached to the carrier and is connected in communication with the smart chip. The memory chip has a larger footprint than the smart chip, overlies the smart chip, and is attached to the carrier by connections around the periphery of the smart chip.

According to another aspect, an exemplary tetherless apparatus includes a carrier; a smart chip that is attached to the carrier; a memory chip that is attached to the carrier and is connected in communication with the smart chip, wherein the memory chip has a larger footprint than the smart chip, overlies the smart chip, and is attached to the carrier by connections around the periphery of the smart chip; and an energy storage device that is removably attached to the carrier and electrically connected to the carrier via a flex bridge.

In view of the foregoing, techniques of the present invention can provide substantial beneficial technical effects. For example, one or more embodiments provide one or more of:

Minimum footprint package with non-volatile storage, which allows minimum size package profile, better suited for enabling embeddedness into materials or products.

Same package is compatible with/without battery.

With no battery (relying on energy harvesting), ability to eliminate shelf life and associated in field battery human labor serviceability costs.

Optical energy harvesting and RF energy harvesting is accomplished by photovoltaics in the chip carrier, or antennae on the chip carrier or package lid, respectively.

Modular design allows quick and easy battery replacement, without disassembling rest of package/integrated circuits (ICs).

Minimize testing cost with method that accommodates easy testing interfacing, less constraining larger dimensions, since entire IC carrier is available. Also, non-volatile storage memory (NVSM) may contain self-test algorithms minimizing testing time and costs.

Minimize chip fabrication cost through the choice of having separate optimized smart/processor chip and NVSM chip fabrication nodes.

Further minimize assembly cost by enabling standard, high volume/main stream flip-chip bonding on the carrier.

Further minimize component cost by integrating such functions as energy harvesting (photovoltaics, RF antennae) and communication components (RF antennae, optical photodiodes) into the substrate.

The two (smart/processor and NVSM) chip stacking allows for minimizing the package dimensions and minimized material cost which are proportional to size.

Compatible with but not reliant on three-dimensional (3D) memory chip stacking.

Scalable modular memory to fit end use application without changing packaging substrate layout/footprint.

Stand alone package that is tetherless and is not dependent on needing mounting to a PC board.

Stand alone system in package that includes power function, communication function, computation function, memory and possibly sensors, Allows hermetically sealed package for environmental robustness.

These and other features and advantages of the present invention will become apparent from the following detailed description of illustrative embodiments thereof, which is to be read in connection with the accompanying drawings.

DETAILED DESCRIPTION

In one or more embodiments, a memory chip is mounted over a smart chip onto a common chip carrier to form a tetherless apparatus. The memory chip is connected in communication with the carrier, and, via the carrier, in communication with the smart chip, by making connections from the memory chip to the carrier around the periphery of the smart chip.

In this context, a "smart chip" comprises both a digital circuit or subsystem (e.g., a processor) and an analog circuit or subsystem (e.g., a sensor such as a demodulator and an output device such as an LED driver). In one or more embodiments, the digital circuit of a smart chip comprises at least one of a processor, a state machine, a core, and a neomorphic compute engine, and implements a state machine. (A neuromorphic compute engine is a hardware based accelerator used to increase the performance of deep neural networks.) In one or more embodiments, the analog circuit of a smart chip comprises at least one of optical or radiofrequency (RF) Input/Output (IO) and/or energy harvesting (e.g., photovoltaics or antenna(s)).

Thus, one or more exemplary embodiments relate to a minimum footprint solution for a two (or more) chip substrate-free package containing a smart chip and nonvolatile memory chip storage capability, and a corresponding method of fabrication. To minimize cost and chip size, in one or more embodiments, separate fabrication processing nodes are employed for the smart/processor chip and the nonvolatile memory chip. To preserve the overall minimum cost and size of the final assembly, a two chip package structure and method of fabrication is disclosed.

Figure 1:
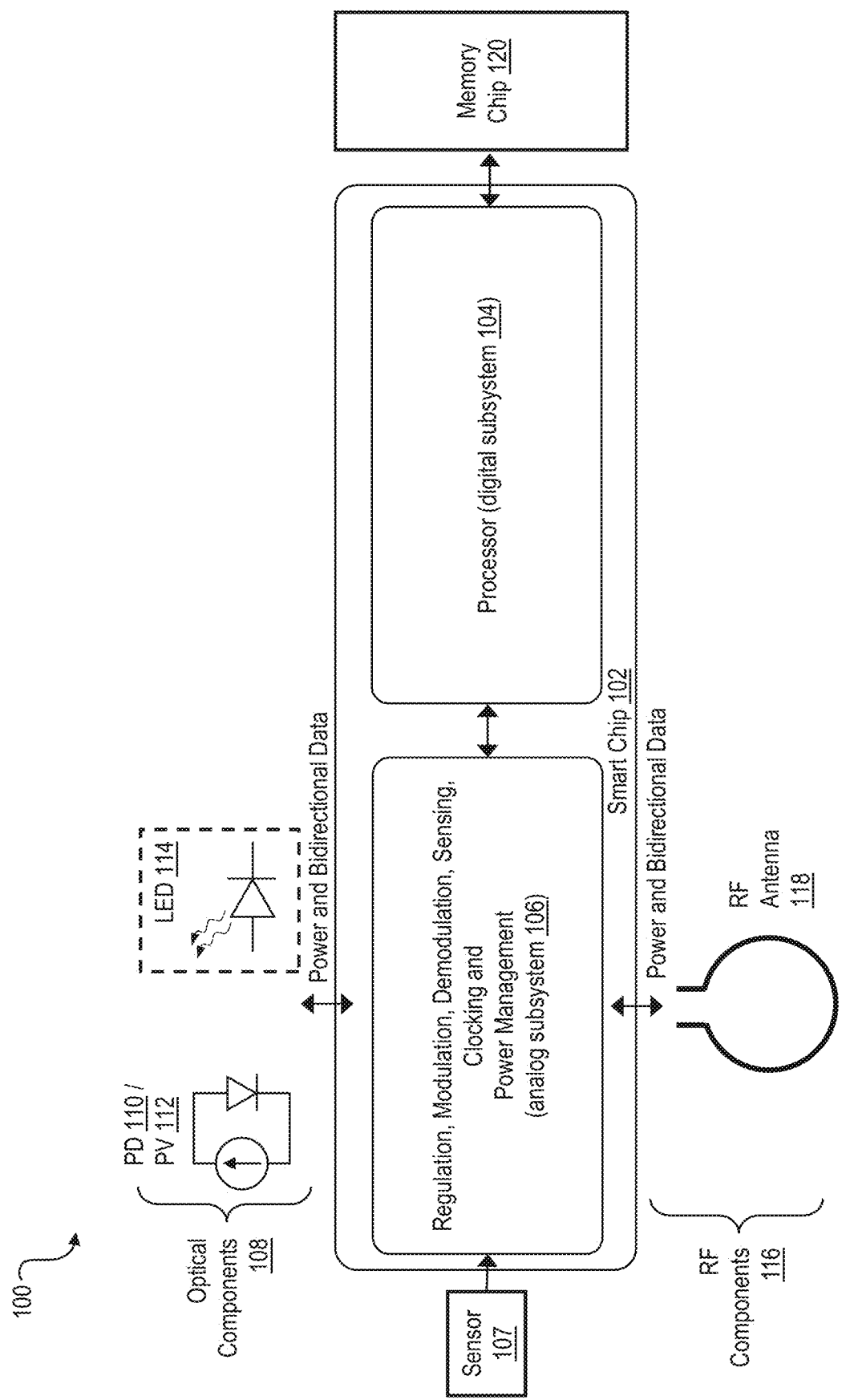
FIG. 1 depicts, in a schematic, some components of a tetherless apparatus, according to an exemplary embodiment.

FIG. 1 depicts in a schematic some components of a tetherless apparatus 100, according to an exemplary embodiment. The apparatus 100 includes a smart chip 102, which in turn includes a digital subsystem 104 and an analog subsystem 106. The digital subsystem includes subcomponents such as a processor, an application-oriented networking (AON) module, and a test and configuration module. The analog subsystem 106 includes subcomponents such as voltage regulation, communications modulation and demodulation, analog sensor drivers, clocking, and power management. Portions of the analog subsystem 106, such as a sensor 107, may be discrete components. In one or more embodiments, the apparatus 100 also includes optical components 108, such as photodiodes 110 and LEDs 114. In one or more embodiments, the apparatus 100 also includes radio frequency (RF) components 116 such as a transmit/receive antenna 118. In one or more embodiments the apparatus 100 also includes power harvesting components 112, such as photovoltaics or an RF inductive power antenna. Additionally, the apparatus 100 includes a memory chip 120.

Figure 2:
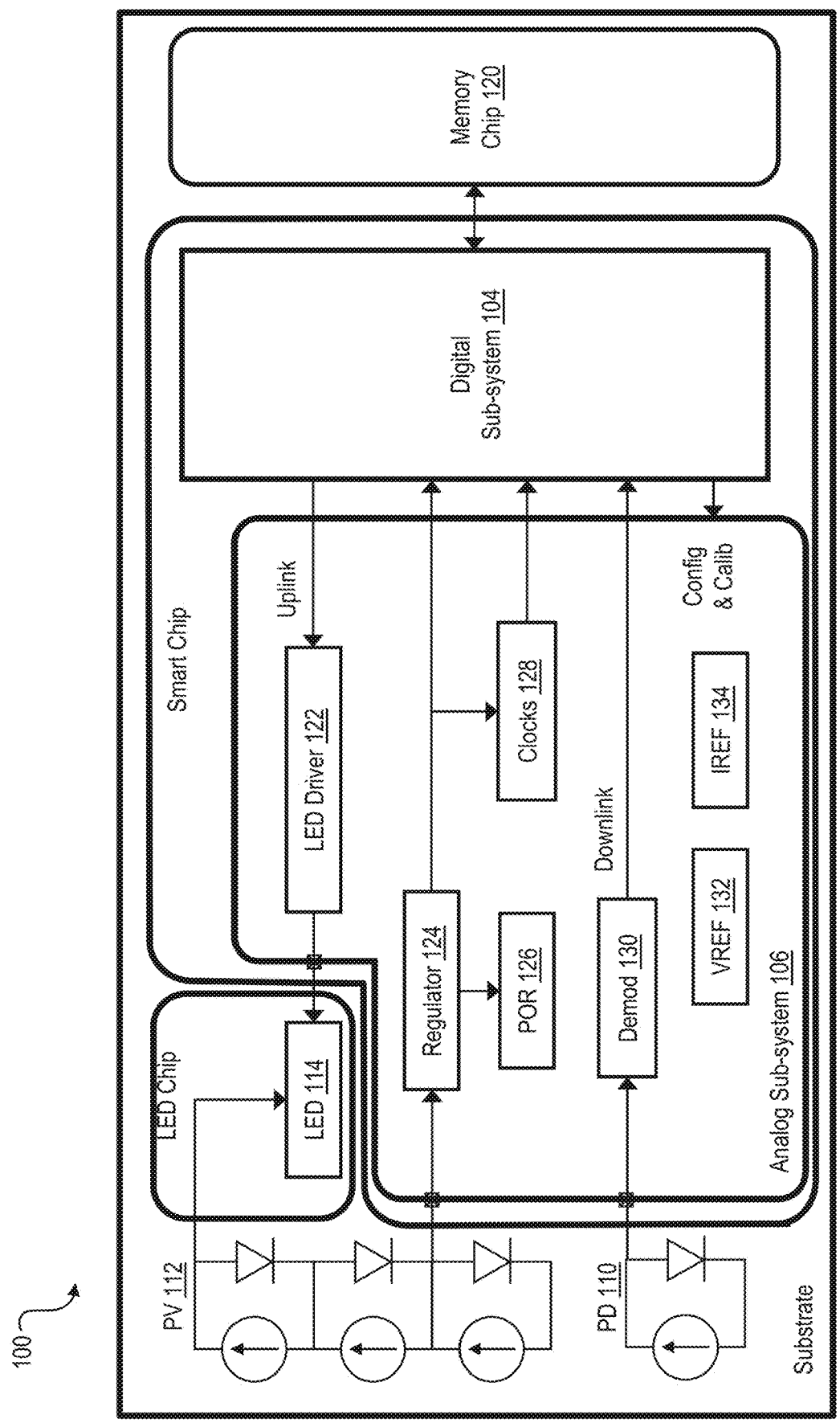
FIG. 2 depicts the apparatus of FIG. 1 in greater detail.

FIG. 2 depicts the apparatus 100 in greater detail, showing the digital subsystem 104, the analog subsystem 106, the photodiodes 110 and the photovoltaics 112 as well as the LED 114 and the memory chip 120. Within the analog subsystem 106, the apparatus 100 includes an LED driver (modulator) 122, a voltage regulator 124, a power-on-reset (POR) module 126, one or more clocks 128, a demodulator 130, a voltage reference 132 and a current reference 134. The LED driver 122 connects an output of the digital subsystem 104 to the LED 114. The voltage regulator 124 connects the photovoltaics 112 to a power terminal of the digital subsystem 104. The clock(s) 128 drive the operation of the digital subsystem 104. The demodulator 130 connects the photodiodes 110 to a data input of the digital subsystem 104.

Figure 3:
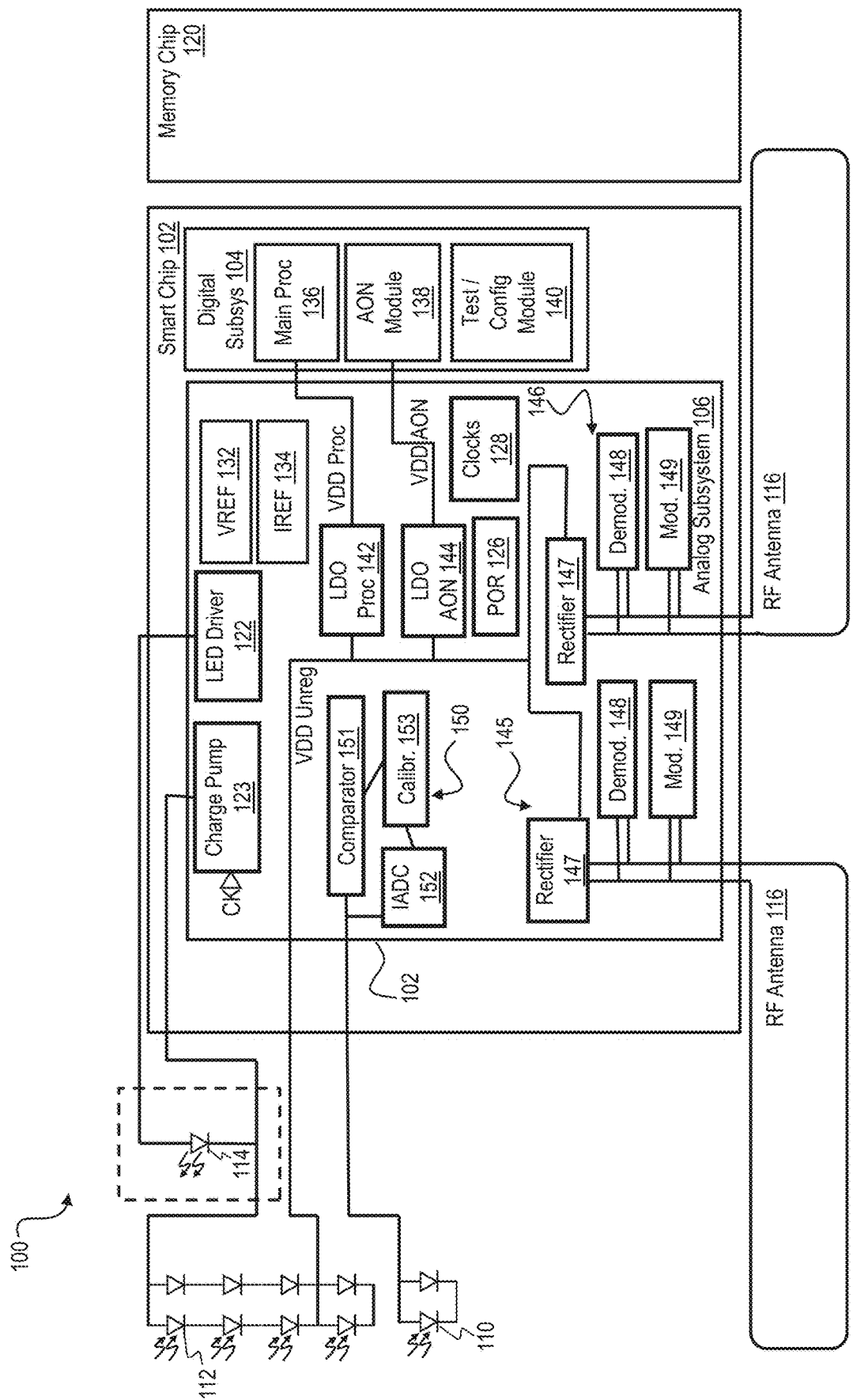
FIG. 3 depicts the apparatus of FIG. 1 in greater detail.

FIG. 3 depicts the apparatus 100 in greater detail, showing the digital subsystem 104, the analog subsystem 106, the photodiodes 110 and the photovoltaics 112 as well as the LED 114, the RF components 116, and the memory chip 120. The digital subsystem 104 is connected in communication with the analog subsystem 106 and in communication with the memory chip 120. The digital subsystem 104 includes a main processor core 136, an application-oriented networking (AON) module 138, and a test and configuration module 140. The analog subsystem 106 includes the LED driver 122 and an associated charge pump 123, the voltage reference 132, the current reference 134, low-dropout voltage regulators (LDOs) 142, 144 for each of the main processor 136 and the AON module 138, the POR module 126, and the clocks module 128. The LDO 142 supplies drive voltage (VDD Proc) to the main processor core 136; the LDO 144 supplies VDD AON to the AON module 138 and to the clocks 128. The POR 126 supplies a reset signal to the digital subsystem 104 at power on. The analog subsystem 106 also includes two radio frequency (RF) power supply circuits 145, 146. Each RF power supply circuit includes a rectifier 147, a modulator 149, and a demodulator 148. The demodulator and the modulator are connected in communication with the processor core 136. The analog subsystem 106 also includes a photodiode input circuit 150. The photodiode input circuit 150 connects the photodiodes 110 to the processor core 136, and includes a calibrator 153, a current-based analog to digital converter (IADC) 152, and a comparator 151 that is connected in communication with the processor core 136.

Figure 4:
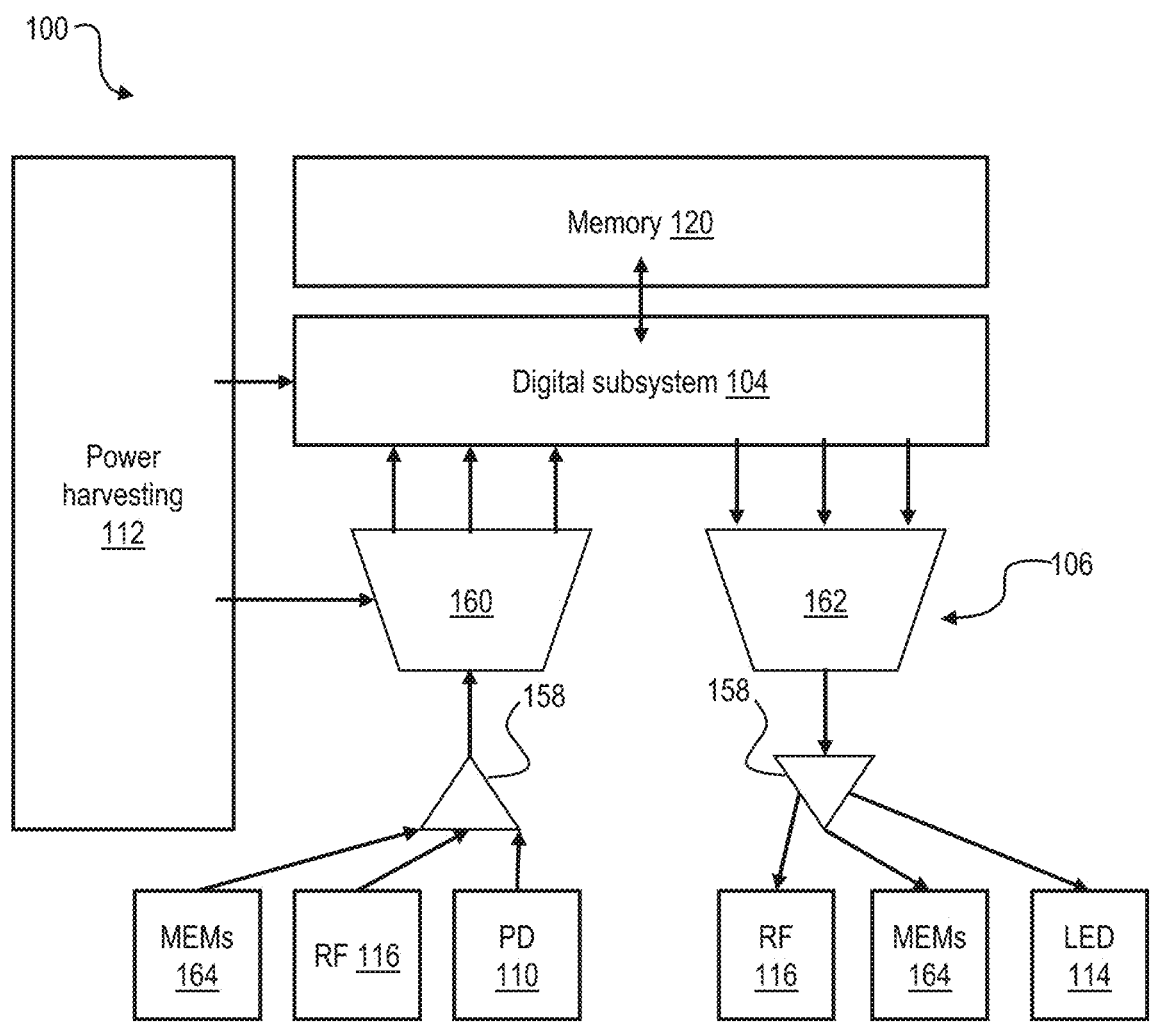
FIG. 4 depicts a high-level schematic of the apparatus of FIG. 1.

FIG. 4 depicts a high-level schematic of the apparatus 100, showing the digital subsystem 104, the analog subsystem 106, the power harvesting (photovoltaics and/or RF Inductive) 112, the photodiodes 110, the LEDs 114, and the RF components 116. The analog subsystem 106 includes input/output (I/O) buffers 158 as well as analog/digital converters (ADCs) 160 and digital/analog converters (DACs) 162. The buffers 158 and the converters 160, 162 are connected in communication between the digital subsystem 104 and the photodiodes 110, LEDs 114, and RF components 116. In one or more embodiments, the apparatus 100 also includes micro-electromechanical (MEM) components 164 (sensors and/or actuators).

Advantageously, in one or more embodiments the devices can locally store their data until enough harvest power is available from the available surrounding environment or a scanner is available to read the data. In one or more embodiments, a device can make use of sleep, hibernation or fully power off state to be compatible with available (lack of) power. The operating system and any local sensor data are preserved by use of local non-volatile semiconductor memory (NVSM) storage.

Figure 5:
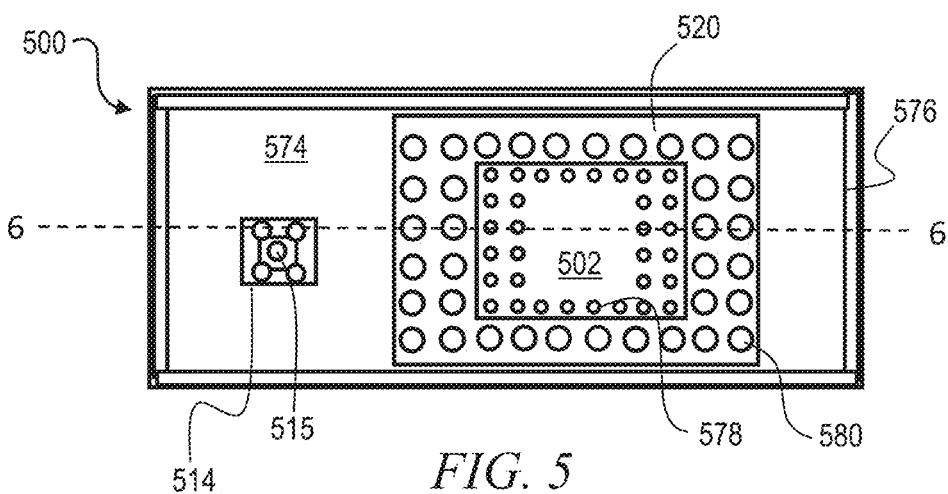
FIG. 5 depicts a bottom up schematic sectional view of a mechanical structure of a tetherless apparatus according to an exemplary embodiment.
Figure 6:
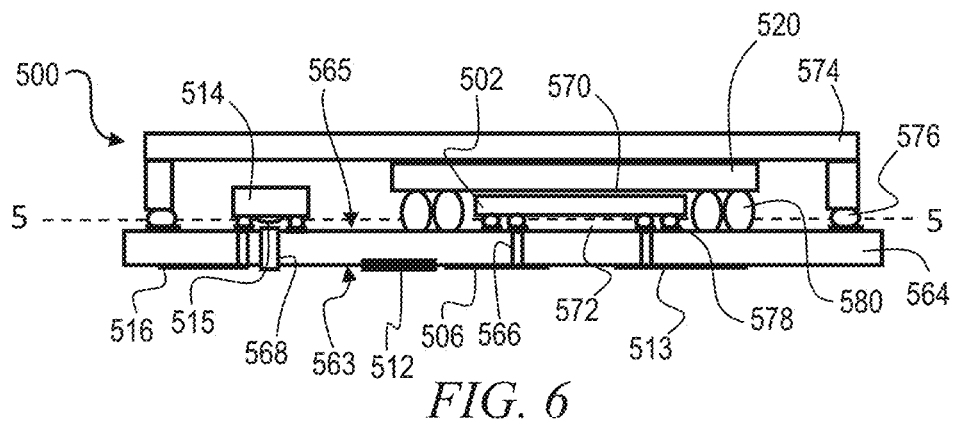
FIG. 6 depicts a side sectional view of the structure of FIG. 5.

FIG. 5 depicts a bottom up schematic sectional view of a mechanical structure of a tetherless apparatus 500, which is an exemplary embodiment of the apparatus 100 that is depicted in schematics in FIG. 1 through FIG. 4. FIG. 6 depicts a side sectional view of the apparatus 500. FIG. 5 is taken at view line 5-5 through FIG. 6, while FIG. 6 is taken at view line 6-6 through FIG. 5.

The apparatus 500 is exemplary of a first-level interconnect minimum package footprint for a smart chip containing optical or radio frequency (RF) input/output (I/O) with a memory chip. The apparatus 500 incorporates 3-D chip-on-chip overlay technology. It is a stand-alone/substrate free (no PC board integrated) package, suitable for IoT and edge computing. The optical energy harvesting via a silicon carrier integrated photovoltaic provides the needed power for less computational or communication demanding applications, but is compatible with additional power via easily serviceable in-field energy storage (battery, supercaps (super capacitors), etc.) option, which is compatible with modular add-on design. It is a hermetically sealed package for environment robustness. It permits modular memory expansion that is packaging footprint (X-Y) independent. The apparatus 500 includes separate NVSM and smart chip technology, and therefore can be optimized to minimize footprint and reduce cost. It can be integrated onto a stand-alone package that includes power function (energy harvesting, storage), communication function (RF and/or optical), smart chip (logic, state machine, processor, etc.), memory, possible sensors, and the like.

Referring to FIG. 5 and FIG. 6, the apparatus 500 includes a smart chip 502 (which includes at least a processor and analog circuitry), a memory chip 520, an LED 514, RF components 516, 512, photodiodes 513, and an analog subsystem 506 (including, e.g., voltage regulation). In this and in other embodiments, the LED 514 can be focusing or defocusing, tailored to a photo-detector/reader. The LED 514 can have a separate lens (component) 515 that is aligned or self-aligned (for example, by solder melt sideways wetting forces) to the LED 514 or to a dielectric layer fabricated onto a GaN LED substrate and etched to the mechanical lens focal geometry required. The RF components 516, the photovoltaics 512, the photodiodes 513, and the analog subsystem 506 are disposed at a bottom surface 563 of a chip carrier 564. In one or more embodiments, the chip carrier 564 is silicon, in which case the bottom components 512, 516, and 506 are fabricated integrally as part of the chip carrier. FIG. 30 through FIG. 35 depict an exemplary circuit and diode structures usable in the integral fabrication of at least the bottom components 506 and 512 within the silicon chip carrier 564. In one or more other embodiments, the chip carrier 564 is an organic laminate, etc., in which case the bottom components 512, 516, 506 are assembled separately onto the bottom surface 563. In one or more embodiments, the RF components 516 can include any of a loop antenna, a dipole antenna, etc. The analog subsystem 506, which in one or more embodiments is connected in communication with the RF components 516, can contain matching network circuitry, voltage regulation circuitry, etc. In one or more embodiments, the RF components 516 include a first antenna that carries out RF communication, and a second antenna that carries out different protocol RF communication, such as near field communication (NFC), etc. The smart chip 502, the memory chip 520, and the LED 514 are mounted to a top surface 565 of the chip carrier, e.g., by controlled collapse chip connection (C4) technology. The top side components 502, 520, 514 are connected in communication with the bottom side components 506, 512, 516 by through-silicon electrically conducting vias 566. A large optically transparent via 568 permits the LED 514 to illuminate the bottom surface 563. Thermal interface material 570 and underfill 572 enhance heat transfer from the smart chip 502 and the memory chip 520 to a lid 574, and provide the robust mechanical attachment to the chip carrier 564, respectively. The lid 574 is sealed to the chip carrier 564 by a seal 576. The lid 574 is adapted to provide electrical shielding as well as a hermetic seal, or additional radio frequency (RF) induction harvesting, or energy storage (super-caps). The smart chip 502 is electrically and mechanically connected to the chip carrier 564 by C4 solder balls 578 and the memory chip 520 is electrically and mechanically connected to the chip carrier by solder balls 580 that are disposed around the periphery of the smart chip 502.

Figure 7:
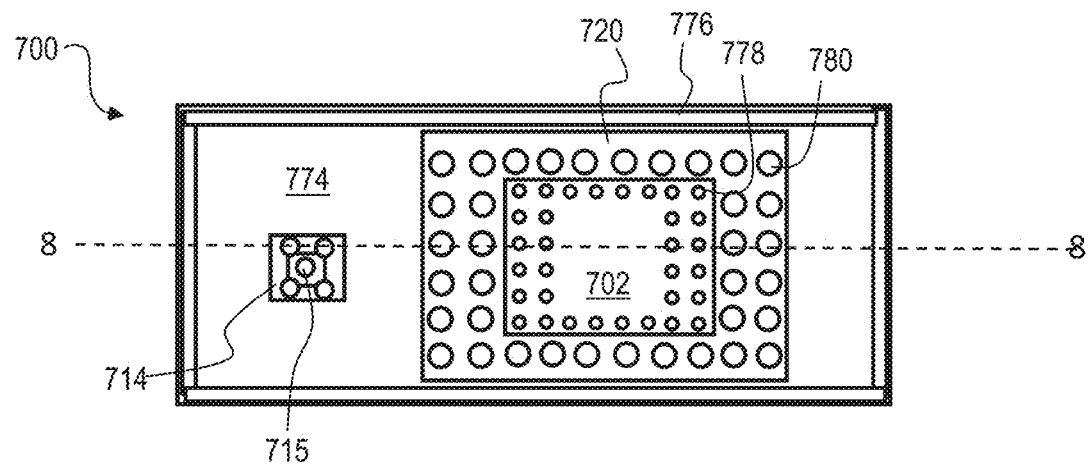
FIG. 7 depicts a bottom up schematic sectional view of a mechanical structure of a tetherless apparatus according to an exemplary embodiment.
Figure 8:
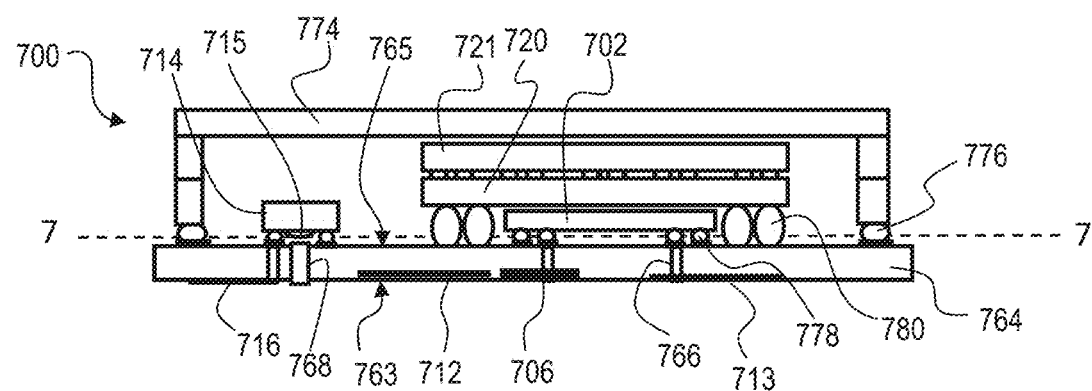
FIG. 8 depicts a side sectional view of the apparatus of FIG. 7.

FIG. 7 depicts a bottom up schematic sectional view of a mechanical structure of a tetherless apparatus 700, which is an exemplary embodiment of the apparatus 100 that is depicted in schematics in FIG. 1 through FIG. 4. FIG. 8 depicts a side sectional view of the apparatus 700. FIG. 7 is taken at view line 7-7 through FIG. 8, while FIG. 8 is taken at view line 8-8 through FIG. 7.

Referring to FIG. 7 and FIG. 8, the apparatus 700 includes a smart chip 702, a memory chip 720, an LED 714, RF components 716, power harvesting (photovoltaics) 712, photodiodes 713, and an analog subsystem 706 (including, e.g., voltage regulation). In one or more embodiments, the LED 714 has a lens 715. The RF components 716, the photovoltaics 712, the photodiodes 713, and the analog (voltage regulation) subsystem 706 are disposed at a bottom surface 763 of a chip carrier 764. The smart chip 702, the memory chip 720, and the LED 714 are mounted to a top surface 765 of the chip carrier, e.g., by controlled collapse chip connection (C4) technology. The top side components 702, 720, 714 are connected in communication with the bottom side components 706, 712, 716 by through-silicon vias 766. A large via 768 permits the LED 714 to illuminate the bottom surface 763. Thermal interface material and underfill enhance heat transfer from the smart chip 702 and the memory chips 720 and 721 to a lid 774, and provide the robust mechanical attachment to the chip carrier 764, respectively. The lid 774 is sealed to the chip carrier 764 by a seal 776. The seal 776 may be of solder, epoxy or other sealing material, The smart chip 702 is electrically and mechanically connected to the chip carrier 764 by C4 solder balls 778 and the memory chip 720 is electrically and mechanically connected to the chip carrier by solder balls 780 that are disposed around the periphery of the smart chip 702. A second memory chip 721 with electrical pads is stacked on top of the first memory chip 720 with coinciding and aligned through-silicon-vias, and is connected in communication with the first memory chip 720 by pad-to-via solder bonding.

Figure 9:
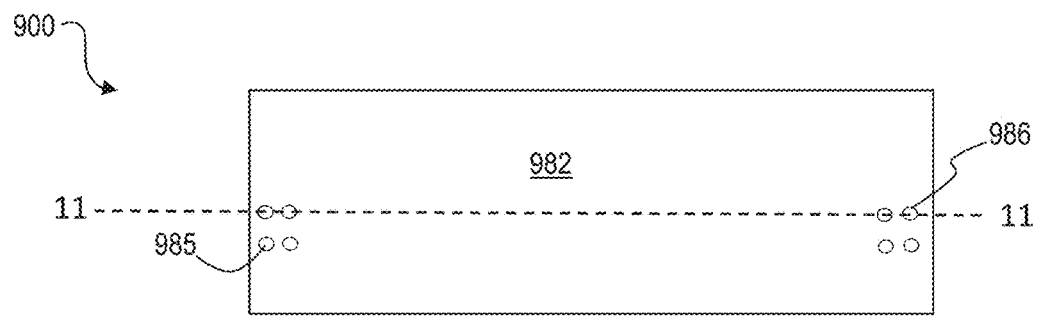
FIG. 9 depicts a bottom up schematic sectional view of a mechanical structure of a tetherless apparatus, according to an exemplary embodiment.
Figure 10:
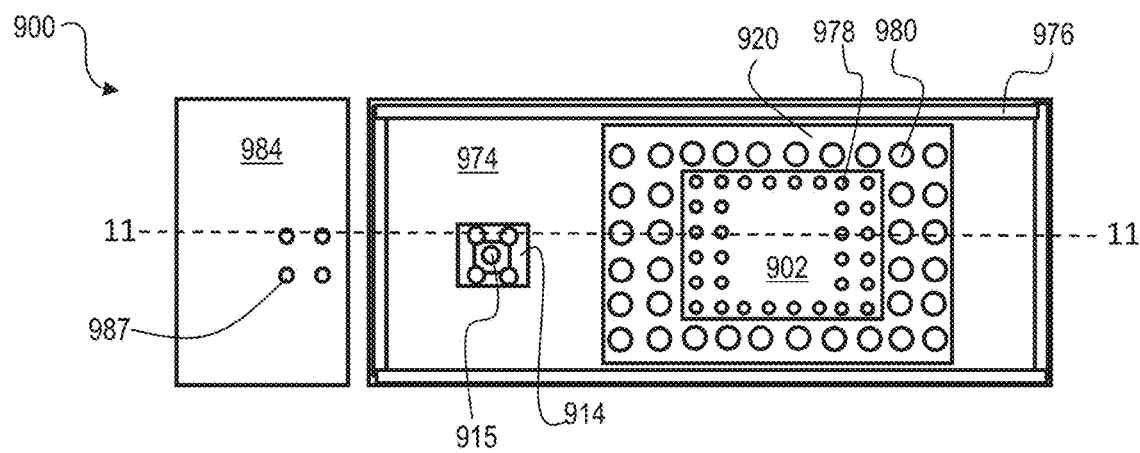
FIG. 10 depicts another bottom up sectional view of the apparatus of FIG. 9.
Figure 11:
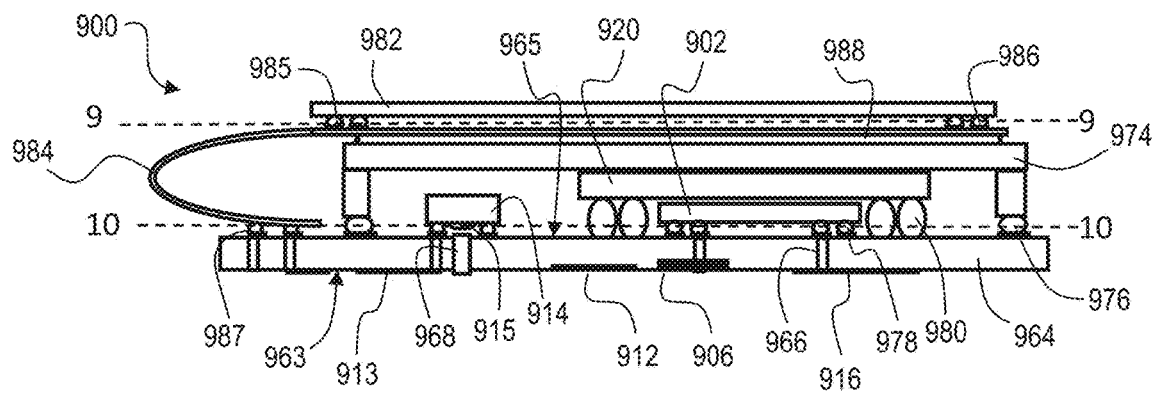
FIG. 11 depicts a side sectional view of the apparatus of FIG. 9.

FIG. 9 depicts a bottom up schematic sectional view of a mechanical structure of a tetherless apparatus 900, which is an exemplary embodiment of the apparatus 100 that is depicted in schematics in FIG. 1 through FIG. 4. FIG. 10 depicts another bottom up sectional view of the apparatus 900. FIG. 11 depicts a side sectional view of the apparatus 900. FIG. 9 is taken at view line 9-9 through FIG. 11 and FIG. 10 is taken at view line 10-10 through FIG. 11, while FIG. 11 is taken at view line 11-11 through FIG. 9 and FIG. 10.

Figure 12:
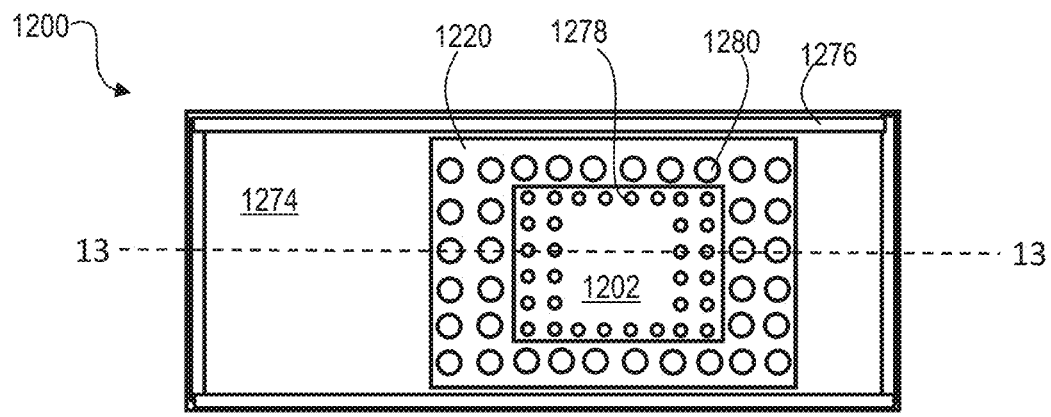
FIG. 12 depicts a bottom up schematic sectional view of a mechanical structure of a tetherless apparatus, according to an exemplary embodiment.
Figure 13:
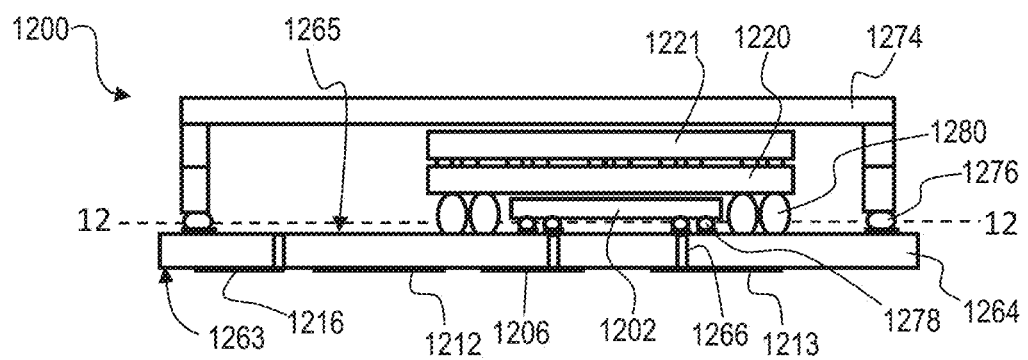
FIG. 13 depicts a side sectional view of the apparatus of FIG. 12.

Referring to FIG. 9, FIG. 10, and FIG. 11, the apparatus 900 includes a smart chip 902, a memory chip 920, an LED 914, RF components 916, power harvesting (photovoltaics) 912, photodiodes 913, and an analog subsystem 906 (including, e.g., voltage regulation). The RF components 916, the photovoltaics 912, the photodiodes 913, and the analog subsystem 906 are disposed at a bottom surface 963 of a chip carrier 964. The smart chip 902, the memory chip 920, and the LED 914 are mounted to a top surface 965 of the chip carrier, e.g., by controlled collapse chip connection (C4) technology. The LED 914 has a lens 915. The top side components 902, 920, 914 are connected in communication with the bottom side components 906, 912, 916 by through-silicon electrically conducting vias 966. A large optical transparent via 968 permits the LED 914 to illuminate the bottom surface 963. Thermal interface material and underfill enhance heat transfer from the smart chip 902 and the memory chip 920 to a lid 974, and provide the robust mechanical attachment to the chip carrier 964, respectively. The lid 974 is sealed to the chip carrier 964 by a seal 976. The seal 976 may be of solder, epoxy or other sealing material. The smart chip 902 is electrically and mechanically connected to the chip carrier 964 by C4 solder balls 978 and the memory chip 920 is electrically and mechanically connected to the chip carrier by solder balls 980 that are disposed around the periphery of the smart chip 902. A battery 982 is electrically connected with the chip carrier 964 by an electrical flex bridge 984, which has anode interconnects 985 and cathode interconnects 986. The flex bridge 984 is attached to the carrier by C4 solder balls 987 and is attached to the lid 974 by an adhesive 988. In one or more embodiments, the battery 982 can be solid state primary or secondary. Advantageously, a solid state form factor is easily matched to the lid 974 dimensions via a flex assembly. The solid state battery may be of rigid or flexible construction, FIG. 12 depicts a bottom up schematic sectional view of a mechanical structure of a tetherless apparatus 1200, which is an exemplary embodiment of the apparatus 100 that is depicted in schematics in FIG. 1 through FIG. 4. FIG. 13 depicts a side sectional view of the apparatus 1200. FIG. 12 is taken at view line 12-12 through FIG. 13, while FIG. 13 is taken at view line 13-13 through FIG. 12.

Referring to FIG. 12 and FIG. 13, the apparatus 1200 includes a smart chip 1202, a memory chip 1220, RF components 1216, power harvesting (photovoltaics) 1212, photodiodes 1213, and an analog subsystem 1206 (including, e.g., voltage regulation). The RF components 1216, the photovoltaics 1212, the photodiodes 1213, and the analog subsystem 1206 are disposed at a bottom surface 1263 of a chip carrier 1264. The smart chip 1202 and the memory chip 1220 are mounted to a top surface 1265 of the chip carrier, e.g., by controlled collapse chip connection (C4) technology. The top side components 1202, 1220 are connected in communication with the bottom side components 1206, 1212, 1216 by through-silicon vias 1266. Thermal interface material and underfill enhance heat transfer from the smart chip 1202 and the memory chip 1220 to the chip carrier 1264 and to a lid 1274. The lid 1274 is sealed to the chip carrier 1264 by a seal 1276. The smart chip 1202 is electrically and mechanically connected to the chip carrier 1264 by C4 solder balls 1278 and the memory chip 1220 is electrically and mechanically connected to the chip carrier by solder balls 1280 that are disposed around the periphery of the smart chip 1202. A second memory chip 1221 with electrically conductive pads is stacked on top of the first memory chip 1220 with coinciding and aligned silicon through vias, and is connected in communication with the first memory chip 1220 by pad-to-via solder bonding.

Figure 14:
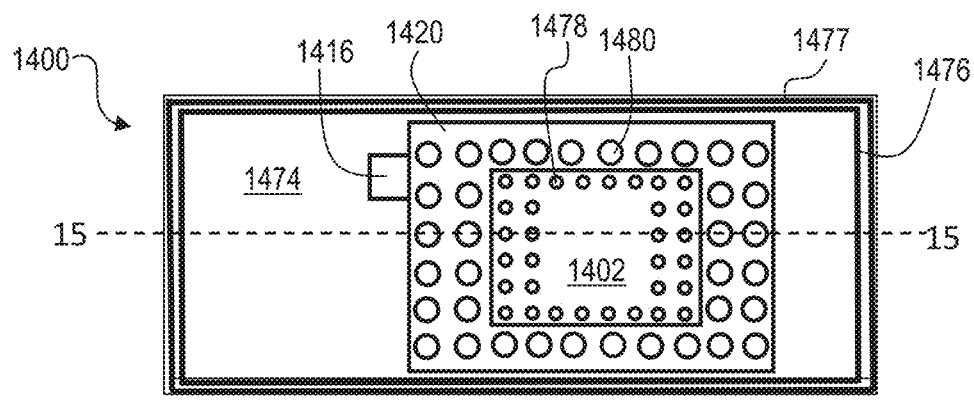
FIG. 14 depicts a bottom up schematic sectional view of a mechanical structure of a tetherless apparatus, according to an exemplary embodiment.
Figure 15:
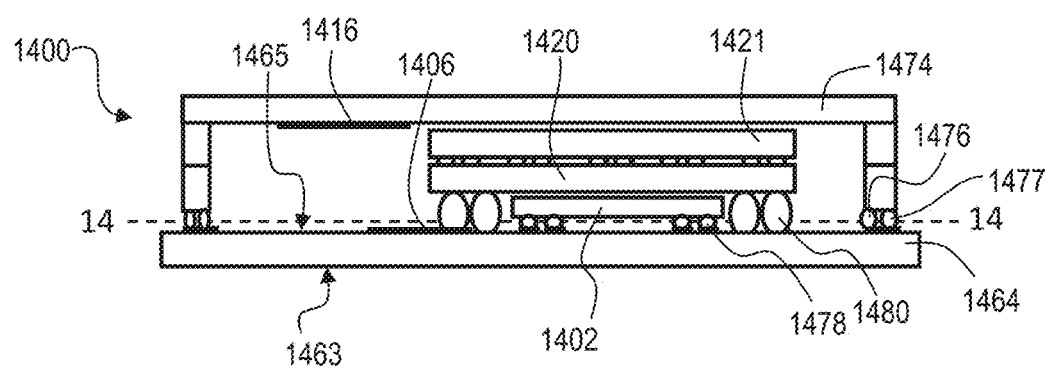
FIG. 15 depicts a side sectional view of the apparatus of FIG. 14.

FIG. 14 depicts a bottom up schematic sectional view of a mechanical structure of a tetherless apparatus 1400, which is an exemplary embodiment of the apparatus 100 that is depicted in schematics in FIG. 1 through FIG. 4. FIG. 15 depicts a side sectional view of the apparatus 1400. FIG. 14 is taken at view line 14-14 through FIG. 15, while FIG. 15 is taken at view line 15-15 through FIG. 14.

Referring to FIG. 14 and FIG. 15, the apparatus 1400 includes a smart chip 1402, a memory chip 1420, RF components 1416 that are used for both communication and power harvesting, and an analog subsystem 1406. The analog subsystem 1406 (including, e.g., voltage regulation) is fabricated integrally as part of a top surface 1465 of a chip carrier 1464. The RF components 1416 are connected electrically to the smart chip 1402 through a conductive path from 1416 down the lid 1474, through the conductive solder 1477, through a conductive trace on the topside of 1464, through the analog (voltage regulation) subsystem 1406, and through the conductive solder contact 1478. Such an embodiment results in lower cost because the through silicon via fabrication steps can be omitted by making the embedded circuitry of the chip carrier 1464 planar on the same side 1465 with the attached chips. The smart chip 1402 and the memory chip 1420 are mounted to a top surface 1465 of the chip carrier, e.g., by controlled collapse chip connection (C4) technology. Thermal interface material and underfill enhance heat transfer from the smart chip 1402 and the memory chip 1420 to the chip carrier 1464 and to a lid 1474. RF components 1416 are formed integrally as part of the lid 1474, or are attached to the top side or bottom side of the lid. The lid 1474 is sealed to the chip carrier 1464 by a double ring seal 1476, 1477. The inner ring 1476 and the outer ring 1477 electrically connect the RF components 1416 to the analog subsystem 1406 that is formed in the chip carrier 1464. In one or more embodiments, an antenna of the RF components 1416 is external (on top of) the lid 1474. In one or more embodiments, the antenna of the RF components 1416 is internal (on the bottom of) the lid 1474, given a proper selection of lid insulating and dielectric constant materials. The smart chip 1402 is electrically and mechanically connected to the chip carrier 1464 by C4 solder balls 1478 and the memory chip 1420 is electrically and mechanically connected to the chip carrier by solder balls 1480 that are disposed around the periphery of the smart chip 1402. A second memory chip 1421 with electrical pads is stacked on top of the first memory chip 1420 with coinciding and aligned silicon through vias, and is connected in communication and in power with the first memory chip 1420 by pad-to-via solder bonding. The through vias of memory chip 1420 provide the electrically conducting path from the top of memory chip 1420 to the bottom side of 1420 and to solder balls 1480.

Figure 16:
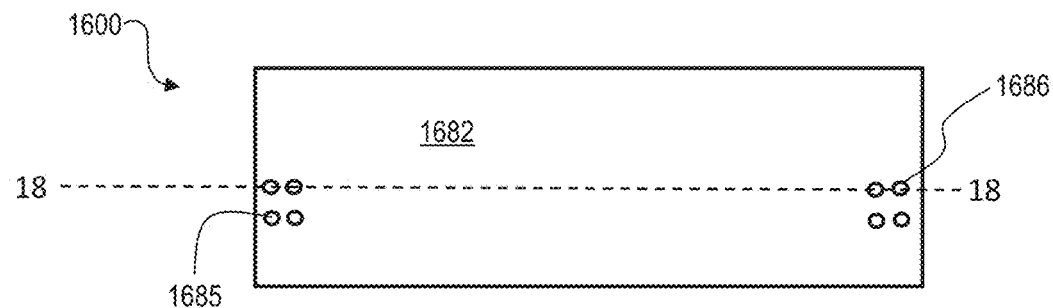
FIG. 16 depicts a bottom up schematic sectional view of a mechanical structure of a tetherless apparatus, according to an exemplary embodiment.
Figure 17:
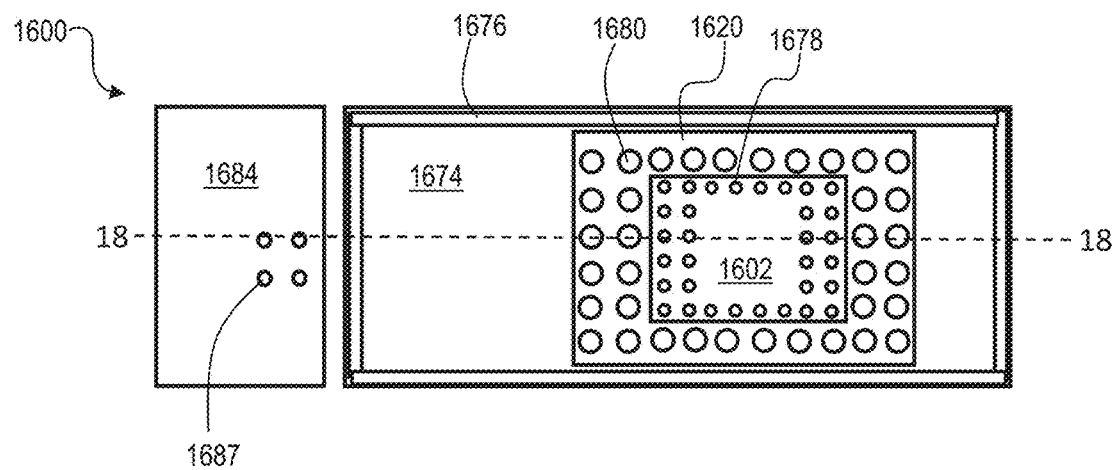
FIG. 17 depicts another bottom up sectional view of the apparatus of FIG. 16.
Figure 18:
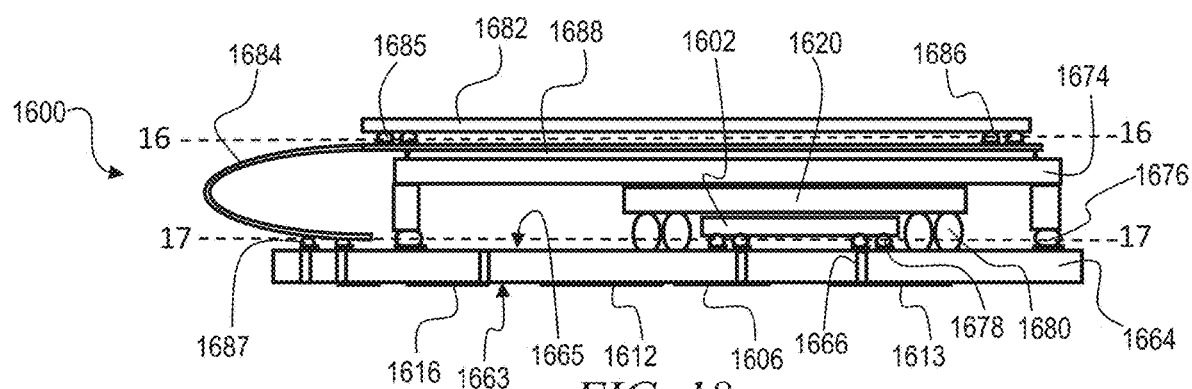
FIG. 18 depicts a side sectional view of the apparatus of FIG. 16.

FIG. 16 depicts a bottom up schematic sectional view of a mechanical structure of a tetherless apparatus 1600, which is an exemplary embodiment of the apparatus 100 that is depicted in schematics in FIG. 1 through FIG. 4. FIG. 17 depicts another bottom up sectional view of the apparatus 1600. FIG. 18 depicts a side sectional view of the apparatus 1600. FIG. 16 is taken at view line 16-16 through FIG. 18 and FIG. 17 is taken at view line 17-17 through FIG. 18, while FIG. 18 is taken at view line 18-18 through FIG. 16 and FIG. 17.

Referring to FIG. 16, FIG. 17, and FIG. 18, the apparatus 1600 includes a smart chip 1602, a memory chip 1620, RF components 1616 for communication and also may be used as RF energy harvesting, power harvesting (photovoltaics) 1612, photodiodes 1613, and an analog subsystem 1606 (including, e.g., voltage regulation). The RF components 1616, the photovoltaics 1612, the photodiodes 1613, and the analog subsystem 1606 are disposed at a bottom surface 1663 of a chip carrier 1664. The smart chip 1602 and the memory chip 1620 are mounted to a top surface 1665 of the chip carrier, e.g., by controlled collapse chip connection (C4) technology. The top side components 1602, 1620 are connected in communication with the bottom side components 1606, 1612, 1616 by through-silicon vias 1666. Thermal interface material and underfill enhance heat transfer from the smart chip 1602 and the memory chip 1620 to the chip carrier 1664 and to a lid 1674. The lid 1674 is sealed to the chip carrier 1664 by a seal 1676. The smart chip 1602 is electrically and mechanically connected to the chip carrier 1664 by C4 solder balls 1678 and the memory chip 1620 is electrically and mechanically connected to the chip carrier by solder balls 1680 that are disposed around the periphery of the smart chip 1602. A battery 1682 is electrically connected with the chip carrier 1664 by an electrical flex bridge 1684, which has anode interconnects 1685 and cathode interconnects 1686. The flex bridge 1684 is attached to the carrier by C4 solder balls 1687 and is attached to the lid 1674 by an adhesive 1688.

Figure 19:
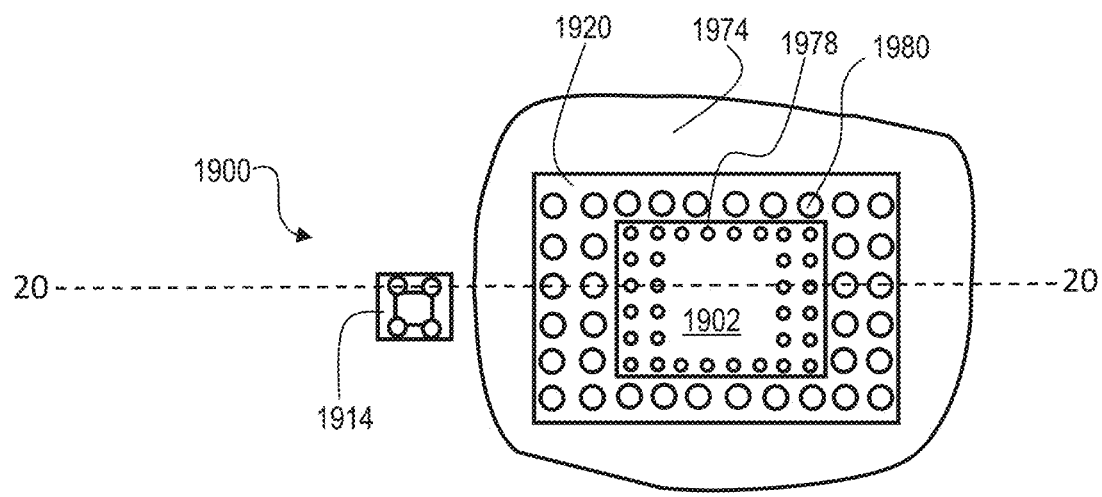
FIG. 19 depicts a bottom up schematic sectional view of a mechanical structure of a tetherless apparatus, according to an exemplary embodiment.
Figure 20:
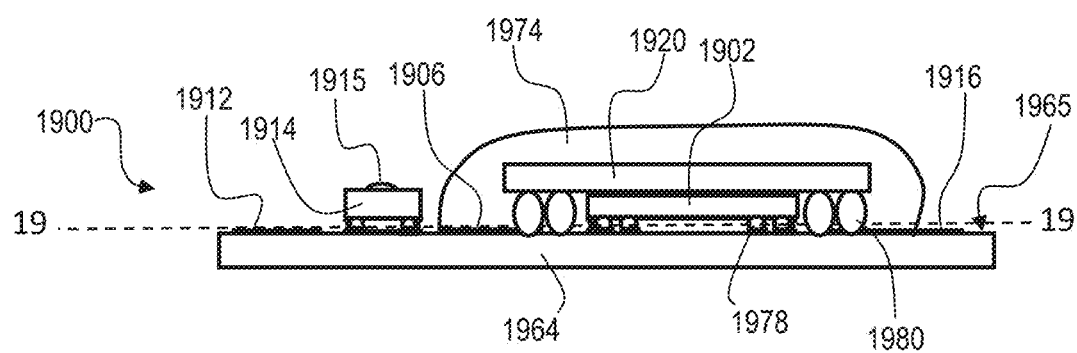
FIG. 20 depicts a side sectional view of the apparatus of FIG. 19.

FIG. 19 depicts a bottom up schematic sectional view of a mechanical structure of a tetherless apparatus 1900, which is an exemplary embodiment of the apparatus 100 that is depicted in schematics in FIG. 1 through FIG. 4. FIG. 20 depicts a side sectional view of the apparatus 1900. FIG. 19 is taken at view line 19-19 through FIG. 20, while FIG. 20 is taken at view line 20-20 through FIG. 19.

Referring to FIG. 19 and FIG. 20, the apparatus 1900 includes a smart chip 1902, a memory chip 1920, an LED 1914, RF components 1916, power harvesting (photovoltaics) 1912, and an analog subsystem 1906 (including, e.g., voltage regulation). The RF components 1916, the photovoltaics 1912, and the analog subsystem 1906 are disposed at a top surface 1965 of a chip carrier 1964. The smart chip 1902, the memory chip 1920, and the LED 1914 are mounted to the top surface 1965 of the chip carrier, e.g., by controlled collapse chip connection (C4) technology. The LED 1914 has a lens 1915. Thermal interface material and underfill enhance heat transfer from the smart chip 1902 and the memory chip 1920 to the chip carrier 1964. The memory chip 1920 and the smart chip 1902 are sealed to the chip carrier 1964 by a glob top 1974. The smart chip 1902 is electrically and mechanically connected to the chip carrier 1964 by C4 solder balls 1978 and the memory chip 1920 is electrically and mechanically connected to the chip carrier by solder balls 1980 that are disposed around the periphery of the smart chip 1902.

Figure 21:
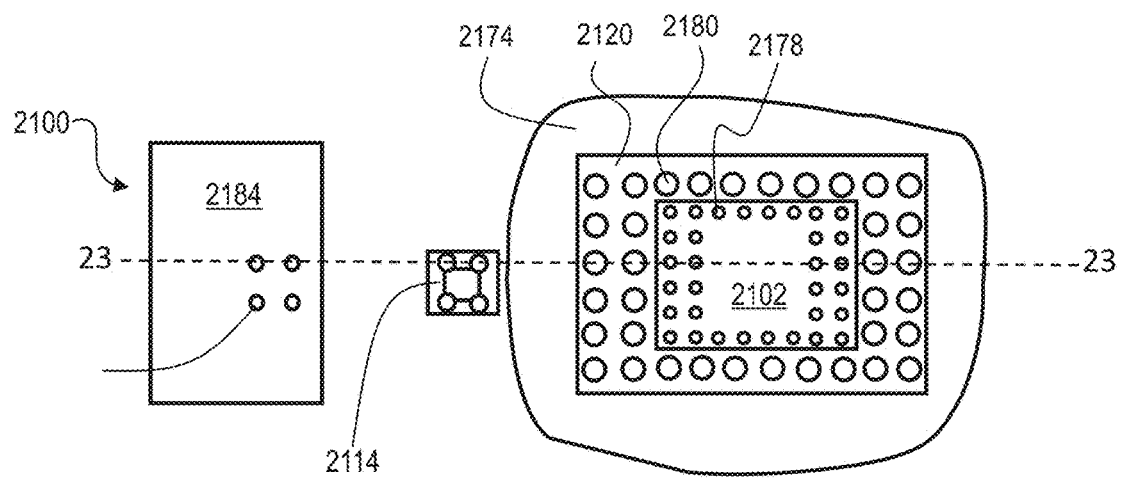
FIG. 21 depicts a bottom up schematic sectional view of a mechanical structure of a tetherless apparatus, according to an exemplary embodiment.
Figure 22:
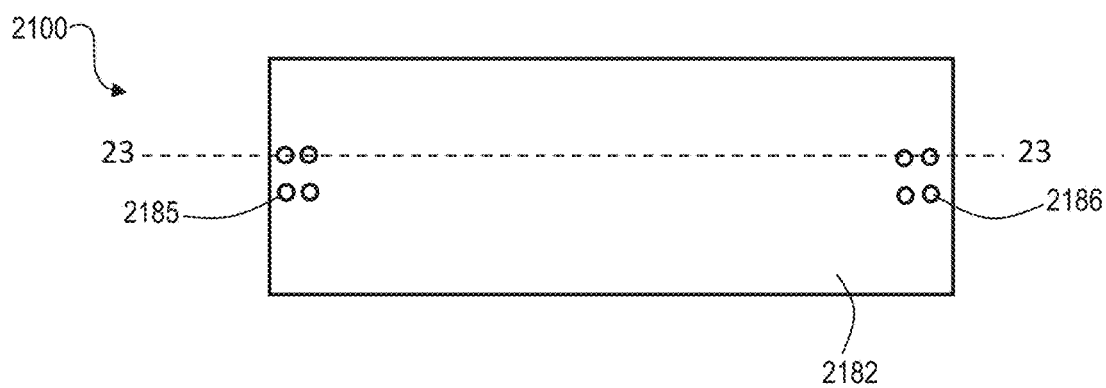
FIG. 22 depicts a top down sectional view of the apparatus of FIG. 21.
Figure 23:
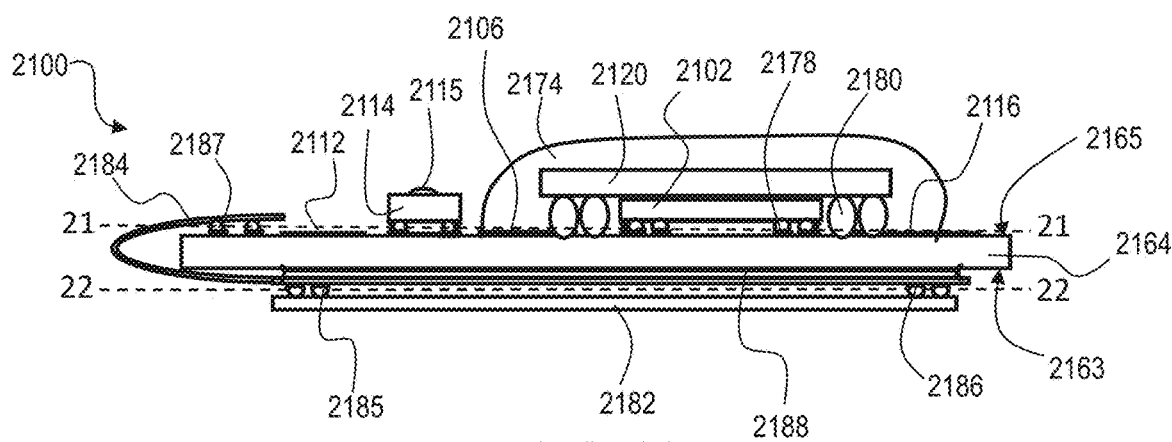
FIG. 23 depicts a side sectional view of the apparatus of FIG. 21.

FIG. 21 depicts a bottom up schematic sectional view of a mechanical structure of a tetherless apparatus 2100, which is an exemplary embodiment of the apparatus 100 that is depicted in schematics in FIG. 1 through FIG. 4. FIG. 22 depicts a top down view of the apparatus 2100. FIG. 23 depicts a side sectional view of the apparatus 2100. FIG. 21 is taken at view line 21-21 through FIG. 23 and FIG. 22 is taken at view line 22-22 through FIG. 23, while FIG. 23 is taken at view line 23-23 through FIG. 21 and FIG. 22.

Referring to FIG. 21, FIG. 22, and FIG. 23, the apparatus 2100 includes a smart chip 2102, a memory chip 2120, an LED 2114, RF components 2116, power harvesting (photovoltaics) 2112, and an analog subsystem 2106 (including, e.g., voltage regulation). The RF components 2116, the photovoltaics 2112, and the analog subsystem 2106 are disposed at a top surface 2165 of a chip carrier 2164. In one or more embodiments, the RF components 2116, the photovoltaics 2112, and the analog subsystem 2106 are formed integrally as part of the chip carrier 2164. The smart chip 2102, the memory chip 2120, and the LED 2114 are mounted to the top surface 2165 of the chip carrier, e.g., by controlled collapse chip connection (C4) technology. In one or more embodiments, the LED has a lens 2115. In one or more embodiments, the LED 2114 can be formed integrally as part of the chip carrier 2164. Thermal interface material and underfill enhance heat transfer from the smart chip 2102 and the memory chip 2120 to the chip carrier 2164. A glob top 2174 seals the smart chip 2102 and the memory chip 2120 to the chip carrier 2164. The smart chip 2102 is electrically and mechanically connected to the chip carrier 2164 by C4 solder balls 2178 and the memory chip 2120 is electrically and mechanically connected to the chip carrier by solder balls 2180 that are disposed around the periphery of the smart chip 2102. A battery 2182 is electrically connected with the chip carrier 2164 by an electrical flex bridge 2184, which has anode interconnects 2185 and cathode interconnects 2186. The flex bridge 2184 is attached to the top surface 2165 of the carrier 2164 by C4 solder balls 2187 and is attached to a bottom surface 2163 of the carrier by an adhesive 2188.

Figure 24:
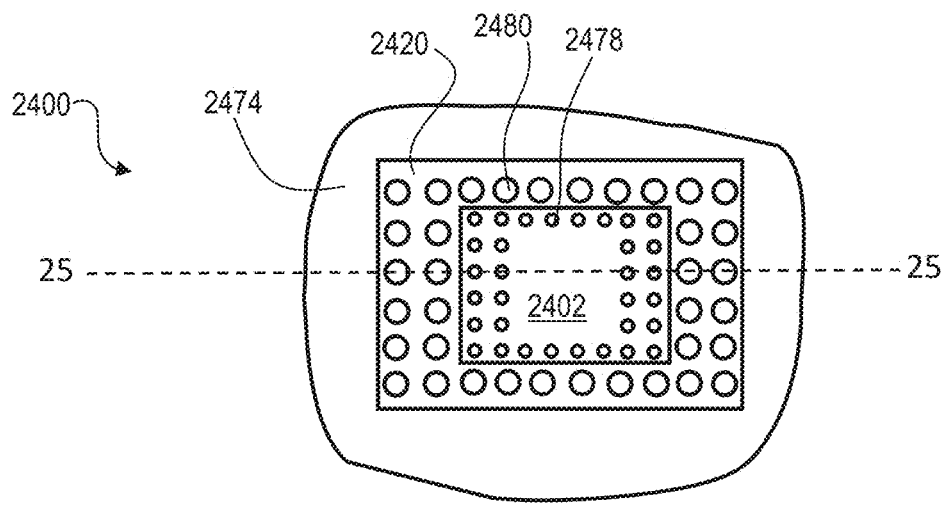
FIG. 24 depicts a bottom up schematic sectional view of a mechanical structure of a tetherless apparatus, according to an exemplary embodiment.
Figure 25:
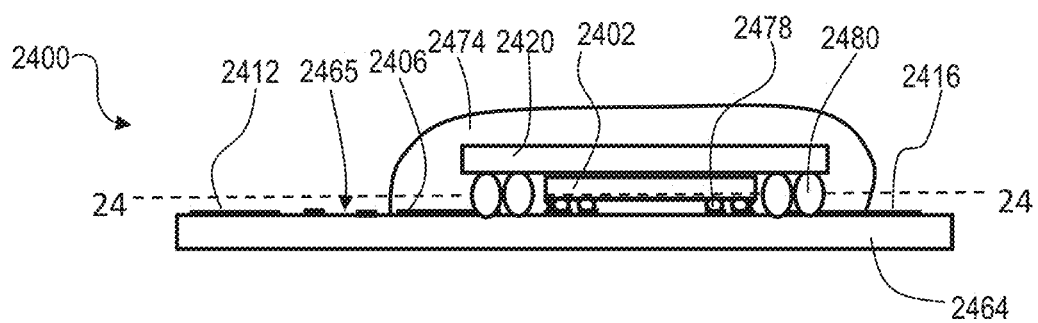
FIG. 25 depicts a side sectional view of the apparatus of FIG. 24.

FIG. 24 depicts a bottom up schematic sectional view of a mechanical structure of a tetherless apparatus 2400, which is an exemplary embodiment of the apparatus 100 that is depicted in schematics in FIG. 1 through FIG. 4. FIG. 25 depicts a side sectional view of the apparatus 2400. FIG. 24 is taken at view line 24-24 through FIG. 25, while FIG. 25 is taken at view line 25-25 through FIG. 24.

Referring to FIG. 24 and FIG. 25, the apparatus 2400 includes a smart chip 2402, a memory chip 2420, RF components 2416, power harvesting (photovoltaics) 2412, and an analog subsystem 2406 (including, e.g., voltage regulation). The RF components 2416, the photovoltaics 2412, and the analog subsystem 2406 are disposed at a top surface 2465 of a chip carrier 2464. In one or more embodiments, the RF components 2416, the photovoltaics 2412, and the analog subsystem 2406 are formed integrally as part of the chip carrier 2464. The smart chip 2402 and the memory chip 2420 are mounted to the top surface 2465 of the chip carrier, e.g., by controlled collapse chip connection (C4) technology. Thermal interface material and underfill enhance heat transfer from the smart chip 2402 and the memory chip 2420 to the chip carrier 2464. A glob top 2474 seals the smart chip 2402 and the memory chip 2420 to the chip carrier 2464. The smart chip 2402 is electrically and mechanically connected to the chip carrier 2464 by C4 solder balls 2478 and the memory chip 2420 is electrically and mechanically connected to the chip carrier by solder balls 2480 that are disposed around the periphery of the smart chip 2402.

Figure 26:
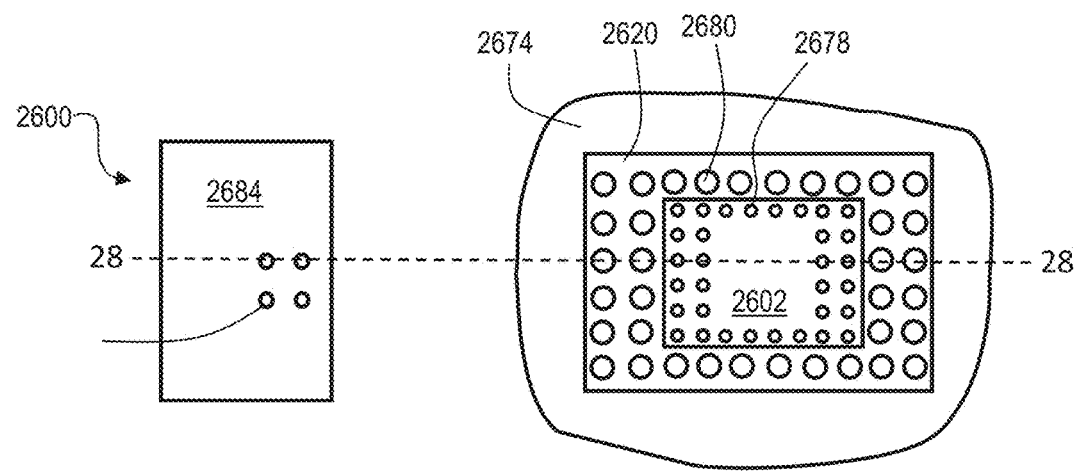
FIG. 26 depicts a bottom up schematic sectional view of a mechanical structure of a tetherless apparatus, according to an exemplary embodiment.
Figure 27:
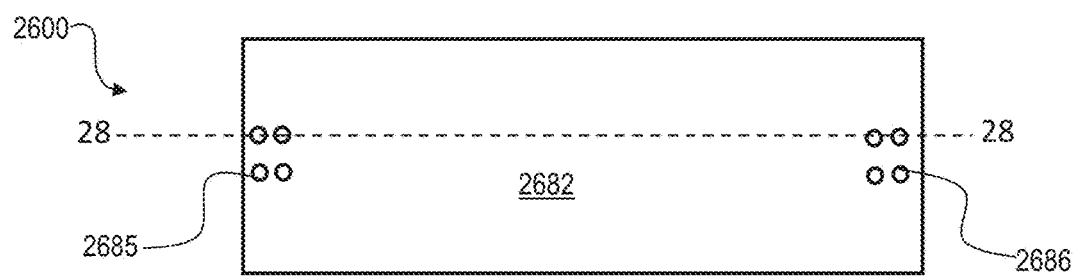
FIG. 27 depicts a top down sectional view of the apparatus of FIG. 26.
Figure 28:
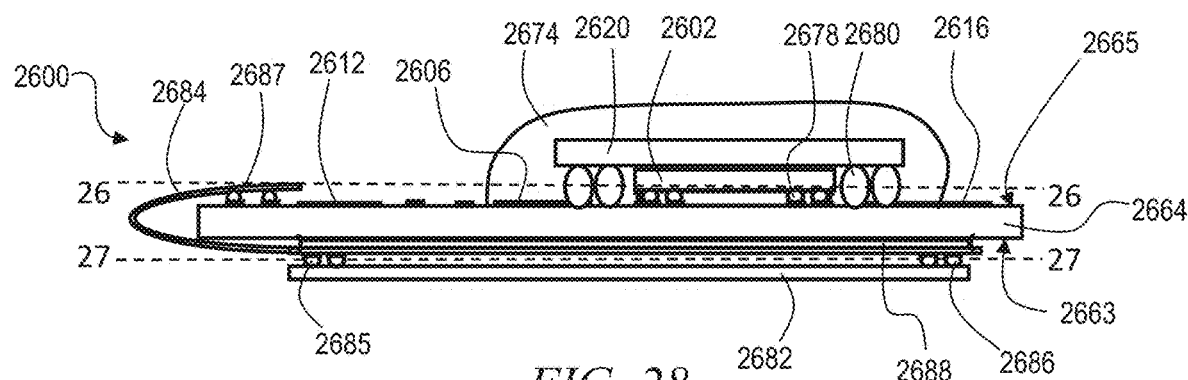
FIG. 28 depicts a side sectional view of the apparatus of FIG. 26.

FIG. 26 depicts a bottom up schematic sectional view of a mechanical structure of a tetherless apparatus 2600, which is an exemplary embodiment of the apparatus 100 that is depicted in schematics in FIG. 1 through FIG. 4. FIG. 27 depicts a top down view of the apparatus 2600. FIG. 28 depicts a side sectional view of the apparatus 2600. FIG. 26 is taken at view line 26-26 through FIG. 28 and FIG. 27 is taken at view line 27-27 through FIG. 28, while FIG. 28 is taken at view line 28-28 through FIG. 26 and FIG. 27.

Referring to FIG. 26, FIG. 27, and FIG. 28, the apparatus 2600 includes a smart chip 2602, a memory chip 2620, RF components 2616, power harvesting (photovoltaics) 2612, and an analog subsystem 2606 (including, e.g., voltage regulation). The RF components 2616, the photovoltaics 2612, and the analog subsystem 2606 are disposed at a top surface 2665 of a chip carrier 2664. In one or more embodiments, the RF components 2616, the photovoltaics 2612, and the analog subsystem 2606 are formed integrally as part of the chip carrier 2664. The smart chip 2602 and the memory chip 2620 are mounted to the top surface 2665 of the chip carrier, e.g., by controlled collapse chip connection (C4) technology. Thermal interface material and underfill enhance heat transfer from the smart chip 2602 and the memory chip 2620 to the chip carrier 2664. A glob top 2674 seals the smart chip 2602 and the memory chip 2620 to the chip carrier 2664. The smart chip 2602 is electrically and mechanically connected to the chip carrier 2664 by C4 solder balls 2678 and the memory chip 2620 is electrically and mechanically connected to the chip carrier by solder balls 2680 that are disposed around the periphery of the smart chip 2602. A battery 2682 is electrically connected with the chip carrier 2664 by an electrical flex bridge 2684, which has anode interconnects 2685 and cathode interconnects 2686. The flex bridge 2684 is attached to the top surface 2665 of the carrier 2664 by C4 solder balls 2687 and to a bottom surface 2663 of the carrier by an adhesive 2688.

Figure 29:
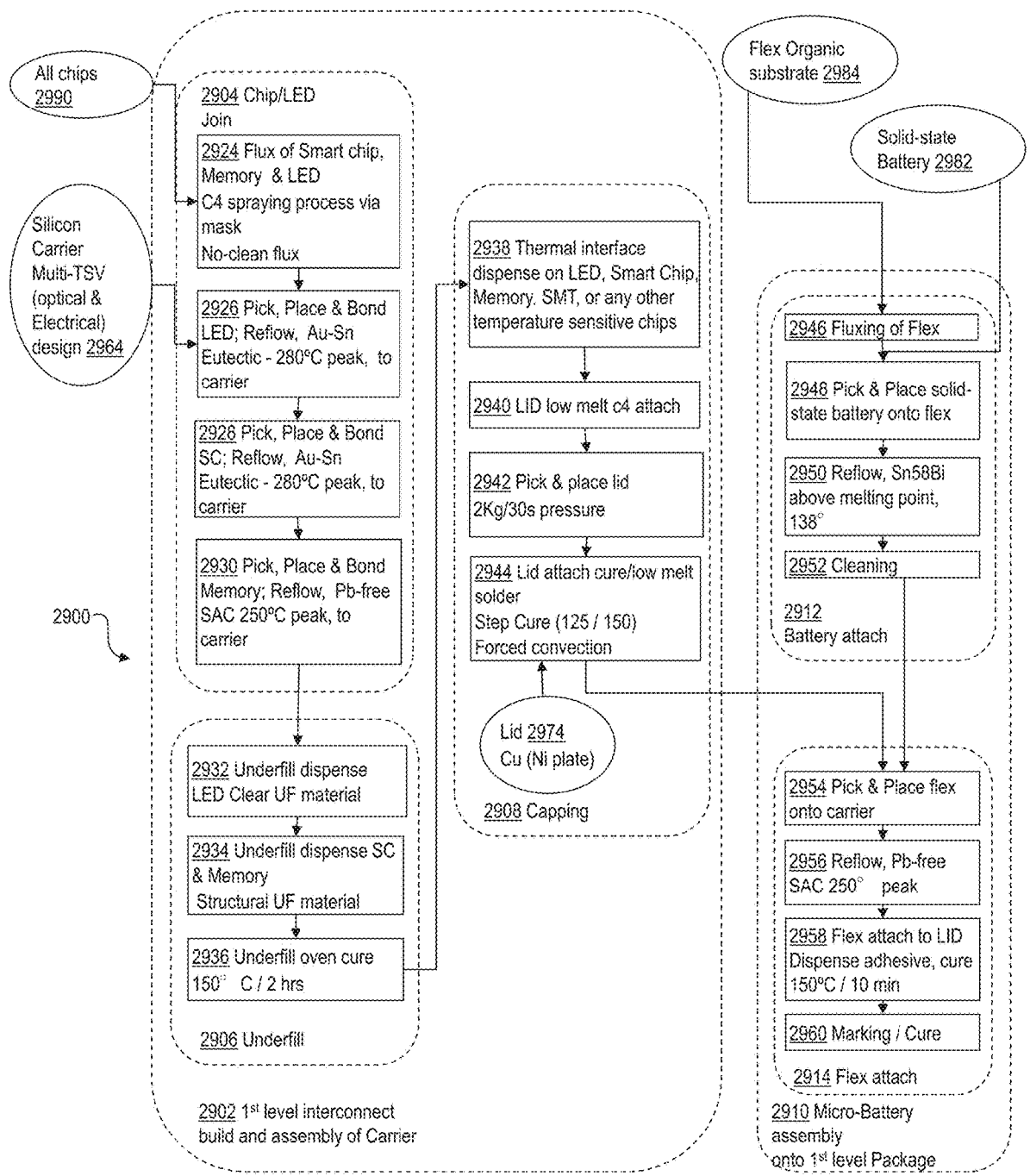
FIG. 29 depicts in a flow chart a method for making an apparatus according to an exemplary embodiment.

FIG. 29 depicts in a flow chart a method 2900 for making an apparatus such as the apparatus 100, according to an exemplary embodiment. Throughout the following description of the exemplary method 2900, specific temperatures, times and materials (such as thermal interface materials, solder flux, and solder metallurgy) are suggested; these values and materials are merely illustrative and in other embodiments, other temperature, times and materials could be used. The method 2900 includes at 2902 a first level interconnect build and assembly of chips 2990 onto a chip carrier 2964. The first level build and assembly includes at 2904 a chip/LED join onto the carrier, at 2906 an underfill process, and at 2908 a capping process. After the first level build and assembly, the method 2900 also includes at 2910 a micro-battery assembly onto the first level interconnect. The micro-battery assembly 2910 includes a battery attach step 2912 and a flex attach step 2914.

The chip/LED join 2904 comprises several steps. At 2924, flux a smart chip (e.g., smart chip 102), memory 120, and LED 114 by a C4 spraying process via mask, using no-clean flux. Other flux materials may be used, such as formic acid gas. At 2926, according to an exemplary embodiment, pick, place and bond the LED 114 to the carrier 2964 by reflowing an Au—Sn eutectic at 280° C. peak. At 2928, according to an exemplary embodiment pick, place and bond the smart chip 102 by reflowing an Au—Sn eutectic at 280° C. peak. At 2930 according to an exemplary embodiment pick, place and bond the memory 120 by reflowing a Pb-free Sn—Ag—Cu solder at 250° C. peak.

Underfilling 2906 also comprises several steps. At 2932 dispense clear underfill material for the LED 114. At 2934 dispense structural underfill material for the smart chip 102 and the memory 120. At 2936, according to an exemplary embodiment oven cure at 150° C. for 2 hours.

The capping step 2908 comprises covering the smart chip 102, the LED 114, and the memory 120 with a lid 2974. At 2938 dispense thermal interface material on the smart chip 102, the LED 114, or any other temperature sensitive chips. As will be appreciated by the skilled artisan, surface-mount technology (SMT) is a method in which the components are mounted or placed directly onto the surface of a printed circuit board (PCB); an electronic device so made is called a surface-mount device (SMD). Usually SMD are of passive devices such as coupling capacitors, and as such are of smaller mechanical height than ICs such as the smart chip 102 and LED 114 and generate an insufficient amount of heat, to warrant not capping with a thermal interface material. At 2940, attach low melting point C4 (controlled collapse chip connection) solder balls to the lid 2974. At 2942, according to an exemplary embodiment, pick and place the lid with 2 kilograms force for 30 seconds. At 2944 attach the lid 2974 to the carrier 2964 by curing the low melt C4 solder—in one or more embodiments with a step cure at 125° C. then 150° C. in a forced convection oven.

The battery attach step 2912 comprises several sub-steps. At 2946, flux a flex organic substrate 2984. At 2948, pick and place a solid-state battery 2982 onto the flex substrate 2984. At 2950, according to an exemplary embodiment, reflow a Sn58-Bi solder compound at 138° C. to attach the battery 2982 to the flex substrate 2984. At 2952, clean the battery and substrate.

The flex attach step 2914 includes at least the following sub-steps. At 2954 pick and place the flex substrate 2984 onto the carrier 2964. At 2956, according to an exemplary embodiment reflow Pb-free Sn—Ag—Cu solder at 250° C. peak. At 2958, attach the flex bridge 2984 to the lid 2974, in one or more embodiments using an adhesive cured at 150° C. for 10 minutes. At 2960, mark or transfer print/symbol onto finished assembly with appropriate part number, origin, etc., and cure.

Figure 30:
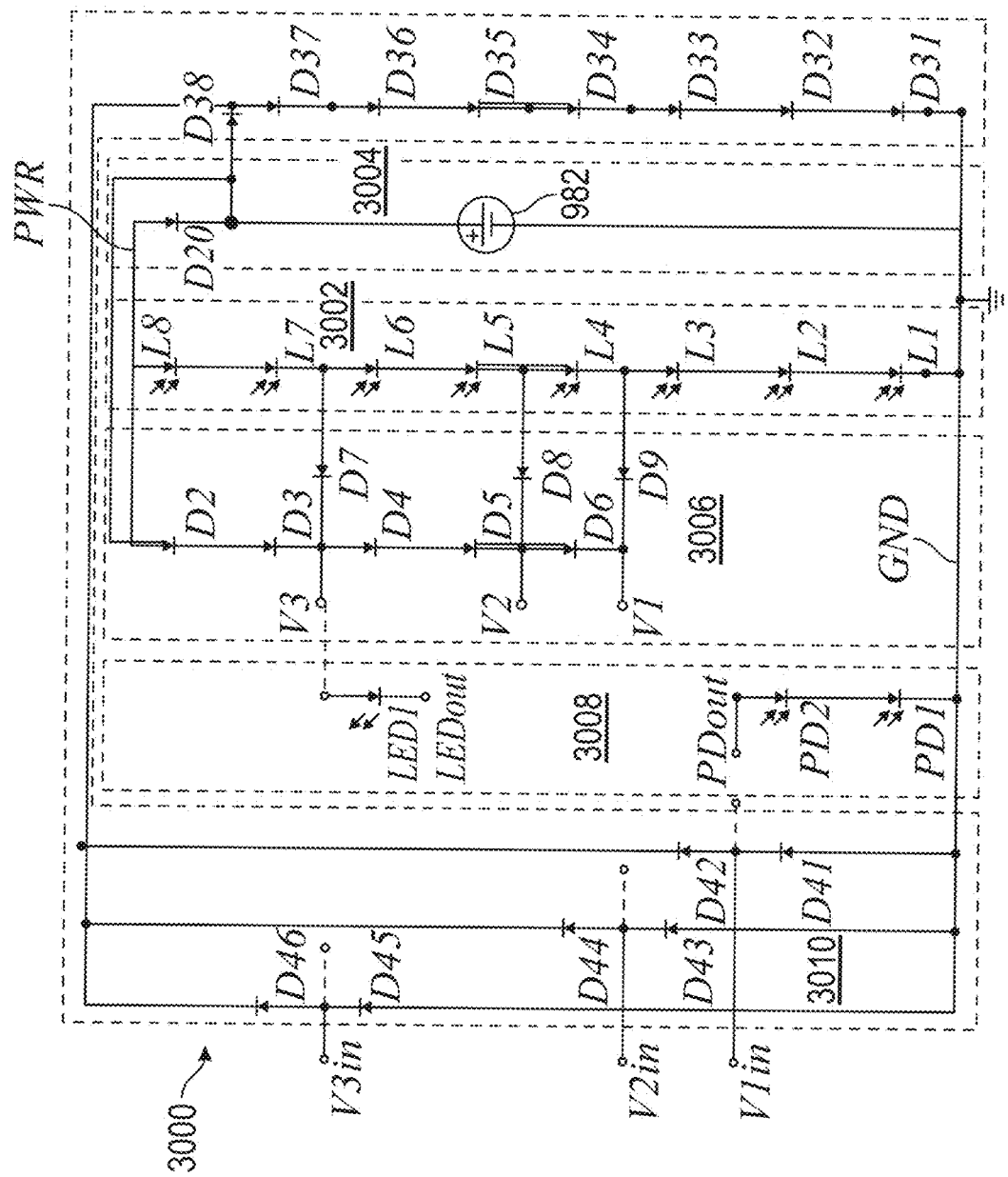
FIG. 30 depicts an exemplary circuit for a functional chip carrier of an apparatus according to an exemplary embodiment.

FIG. 30 depicts an exemplary circuit 3000 for a functional chip carrier of an apparatus according to an exemplary embodiment. Each of the diodes of the circuit 3000 provides a circuit function of at least one of the following:

(1.) Optical power harvesting,
(2.) rectification for energy storage,
(3.) voltage regulation, and
(4.) electrostatic discharge (ESD) protection.

Optical power harvesting can encompass photovoltaics absorbing photons to excite valence electrons, which jump the bandgap of the photovoltaic semiconductor to produce a voltage and a current.

Rectification and voltage regulation can encompass evening out fluctuations of voltage and current that might arise from fluctuating light intensity on a photovoltaic device.

Energy storage can encompass using batteries, capacitors, supercapacitors, or other charge storage devices.

Optical communication can encompass photodiodes for receiving incoming optical communication, laser diodes or light emitting diodes for outgoing optical communication, or other optical communication diodes.

ESD protection can encompass using back-to-back diodes, diode pairs, etc. for any inputs/outputs of the Si Carrier Package.

Diode Circuit Function: (1.) Optical Power Harvesting

Referring specifically to FIG. 30, the exemplary circuit 3000 includes a power rail PWR and a ground rail GND. The circuit 3000 also includes a PV cell array or energy harvesting circuit 3002 (L1, L2, L3, L4, L5, L6, L7, L8) and in one or more embodiments the circuit 3000 also includes an energy storage device 3004. The energy harvesting circuit 3002 and the energy storage device 3004 (if present) are connected between the power rail PWR and the ground rail GND. In one or more embodiments, the PV cell array 3002 has an open circuit voltage that matches the charging voltage of a battery (e.g., the battery 982, though other batteries could be used) plus the forward voltage of the diode D20 (i.e. the total charging voltage of the energy storage device 3004). That is, the PV cell array 3002 wisely includes some additional voltage margin to account for variations in environmental light intensity, fabrication processing, etc. For example, for a 4.2V battery BT5, choose a PV cell array with 4.8V drop or higher to optimize both the parameters.

The above conditions could be difficult to achieve because PV cells are subjected to environmentally varying illumination levels and illumination angles, such as from varying sun ray positions and/or optical scanner position(s).

In some IoT instances, a well-controlled optical scanner interrogates the PV cell array, with the optical scanner having a fixed illumination power and angle of incidence. It is understood that the energy harvesting circuit diode arrangements and numbers can be optimized differently for each use case.

As discussed above, in order to avoid unnecessary loading of the PV cells it is desirable to have conditions ideally matching the PV voltage with the battery technology and battery voltage.

Silicon PV cells have an open circuit voltage of ~0.6V (ranging from 0.5V to 0.7V depending on semiconductor doping and fabrication) and are easily integrated into the silicon carrier package, thus minimizing cost. There are additional options for PV cells that can be fabricated in various other carriers, such as AlGaAs PV cells on Offcut Si, GaAs PV cells on GaAs, AlGaAs PV cells on Silicon-on-Insulator (SOI), Si PV cells on SOI, etc. These non-silicon PV cells have a different bandgap than silicon, and will exhibit a different open circuit voltage. For example, GaAs and AlGaAs PV cells can exhibit an open circuit voltage of ~1.2V and ~1.45V, respectively, per cell. The enclosed embodiments teach various energy harvesting circuits assuming Si PV cells, but it is understood by those skilled in the art that non-silicon PV cells can be substituted by taking into account the different open circuit voltage.

In one or more embodiments, the energy storage device 3004 may be omitted as in FIG. 5 through FIG. 8 and FIG. 12 through FIG. 15.

Diode Circuit Function: (2.) Rectification for Energy Storage

Still referring to FIG. 30, the exemplary circuit 3000 also includes as part of the energy storage device 3004 a rectifying diode D20 that is designed to take into account the maximum current value that can be supplied by the PV cells connected in series (L1 through L8). For example, the maximum current of a photovoltaic cell (L1 through L8) depends upon the size or surface area of the cell's P-N-junction, the amount of light hitting the cell, its efficiency of converting this light into a current, and of course the type of semiconductor material that the cell is fabricated from, e.g., silicon, gallium arsenide, cadmium sulphide, or cadmium telluride.

Figure 33:
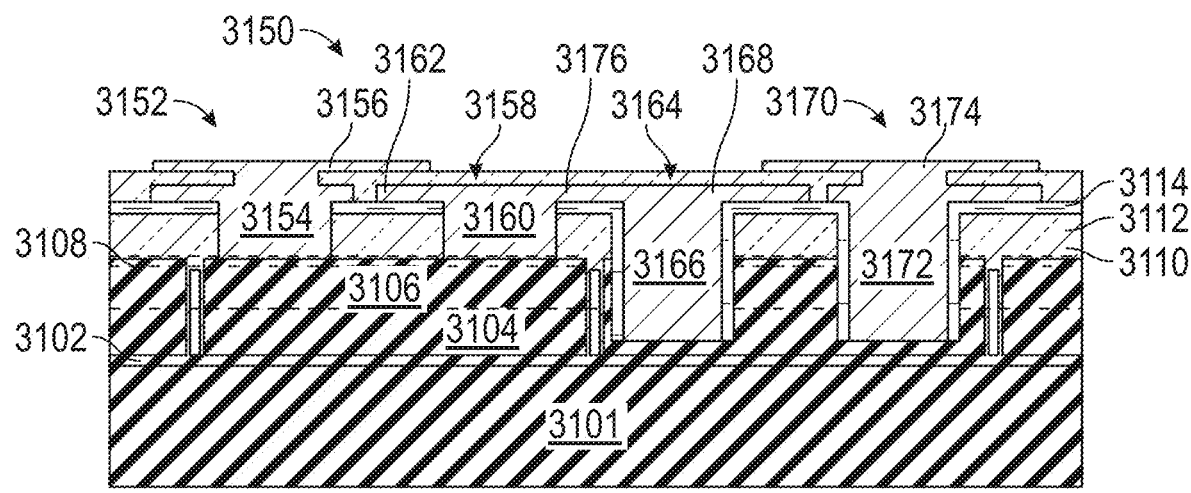
FIG. 33 depicts a shielded P-N diode of a functional chip carrier according to an exemplary embodiment.
Figure 34:
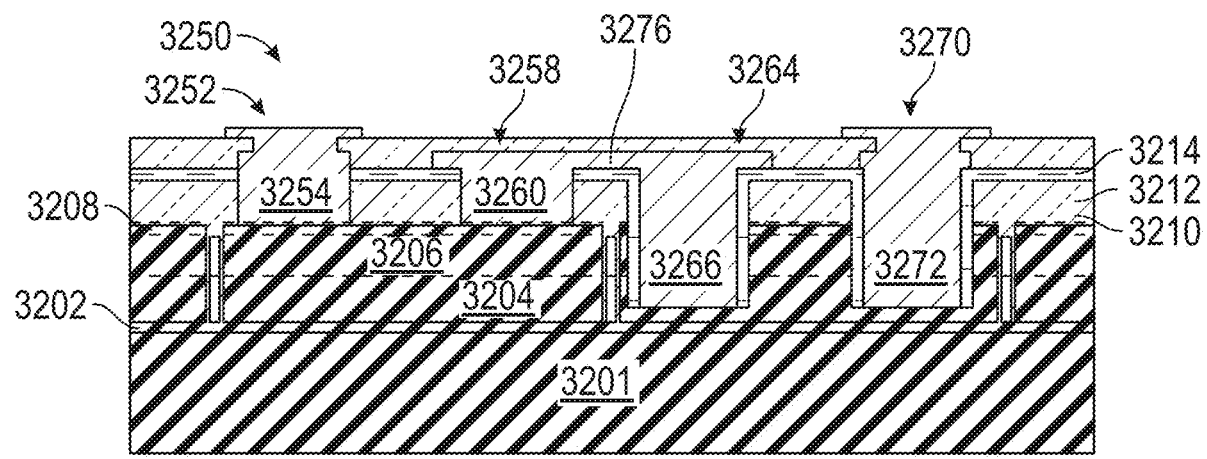
FIG. 34 depicts an unshielded P-N diode of a functional chip carrier according to an exemplary embodiment.

At least three types of diodes can be employed as the rectifying diode(s) (D20, etc.): P-N- or P-I-N-junction diodes and Schottky barrier diodes. All can be fabricated on the silicon carrier with a wide range of current ratings. The Schottky diode has a much lower forward voltage drop of approximately 0.35V as opposed to ~0.6V for the P-N or P-I-N diodes. In general, a lower voltage drop allows power savings, since less power is dissipated in the lower voltage Schottky rectifying diode(s). FIGS. 33 and 34 depict P-N diodes according to an exemplary embodiment; these actually are P-(metal)-N diodes that use two "islands" of semiconductor and a cathode-to-anode via to short across the intrinsic layers of adjacent P-I-N stacks, as will be further discussed below.

Diode Circuit Function: (3.) Regulation

Referring to FIG. 30, the exemplary circuit 3000 includes a voltage regulation device 3006 that comprises diode string D2, D3, D4, D5, D6 and diodes D7 and D9. The node between L3, L4 is at 1.8V above GND in normal operation, while the output of D20 is at 4.2V above GND, i.e. the voltage of the battery BT5. Diode D9 is connected from the L3, L4 node to the low side of diode D6, providing a drop of ~0.6V to D6 from the nominal operating voltage of 1.8V at L3, L4. Power output terminal V1 is connected between D6 and D9 for a regulated level of 1.2V above GND. Diode D7 is connected from the L6, L7 node to the D3, D4 node providing a drop of ~0.6V to D3, D4 from the L6, L7 nominal operating voltage of 3.6V above GND. Power output terminal V3 is connected to the D3, D4 node for a regulated level of 3.0V above GND.

Diode Circuit Function: (4.) ESD Protection.

ESD protection methods require the placement of adequate on-chip protection devices in the Input/Output connections as well as in the power supply rail to absorb ESD energy. The idea of the protection scheme is to limit the voltage and then have a robust path for the ESD currents which flow between any pair of pins. In general, Input/Output connections are shunted to the ground rail under ESD overvoltage. Also, in general, output connections are usually protected at the Inputs of the attached chip and are not shown here for clarity.

For effective whole substrate ESD protection, FIG. 30 shows an ESD protective circuit 110 that not only has the Input/Output connections V1in, V2in, V3in protected (shunted) by diodes D41, D42; D43, D44; and D45, D46, but also clamps the power rails by diodes D31, D32, D33, D34, D35, D36, D37, D38 so that ESD current can be discharged and discharge through internal circuits avoided when a trigger voltage is exceeded. The trigger voltage is generally set higher than the maximum supply voltage to minimize ESD protection current during normal operation. The selection of what type of clamp to employ in a design is based on several criteria. The first criterion is what circuit elements are available in the given process. An exemplary less complex silicon carrier process is a low cost, minimum step process that produces only diodes. Other circuit devices can be added, but at the expense of more complicated processing steps and resulting higher cost.

Fortunately, the p-n diode and diode string in the Si carrier process is robust (compared to scaled thin oxide MOSFETS), and can be utilized. As an illustration, FIG. 30 shows inputs V1in, V2in, and V3in having overvoltage protection via P-N diodes D42, D44 and D46, and undervoltage (negative) protection via diodes D41, D43 and D45, respectively, for any Input connections needed. These diodes will turn on and limit any ESD voltage to one diode voltage drop above the power rail (~4.2V) and one diode voltage drop below GND (~−0.6V), and shunt the ESD current through the diode string D31 through D37 that is clamped across the power rail (battery).

For those skilled in the art, it is understood that one (as shown) or more diodes can be added in series for the overvoltage and undervoltage protection at any Input/Output connection to raise the overvoltage or undervoltage protection limit. Also, other diodes, such as Schottky diodes, can be substituted for the P-N diodes with the advantage of having a lower forward voltage drop (~0.3-0.6V). In a similar manner, to lower the value of overvoltage protection limit of inputs V1in, V2in, and V3in below ~4.2V, diodes D42, D44 and D46 should be disconnected from the node between D36 and D37 and re-connected to a node between diodes D31 and D36. For example, re-connecting diodes D42, D44 and D46 to the node between diode D35 and D36, or between diodes D34 and D35, lowers the overprotection limit by that number of diode voltage drops slipped, or to an overprotection limit of ~3.6V, or ~3.0V, respectively.

The clamping of the power rail via a static clamp, or steady-state current and voltage response, is accomplished by the diode string D31, D32, D33, D34, D35, D36, D37. A fixed voltage level activates the static clamps: a voltage above the diode string on voltage will conduct current and limit any further voltage rise. The number of diode voltage drops in forward bias will dictate the upper voltage limit. For example, the diode string clamp D31 through D36 will shunt current to GND when V1in, V2in, and/or V3in voltage exceeds 4.2V, assuming a P-N diode turn on voltage of 0.6V. Overvoltage protect diode D37 connects in series to the diode string clamp D31 through D36 that provides a maximum voltage of 4.2V across the battery supply while allowing no ESD current shunting through the battery. In FIG. 30, the 4.2V static clamp is intended to protect the 3.6V Li-ion battery, which can tolerate an upper charging voltage of approximately 4.2V. For those skilled in the art, a Zener diode substitution of the diode string clamp D31 through D36, with a Zener breakdown voltage of 3.6V, is possible, and will provide more ESD current independent turn-on shunt voltage in a smaller area, but at the expense of additional processing on top of the basic P-N diode process.

For those skilled in the art, given the teachings herein, a transient clamp is also an option.

Figure 31:
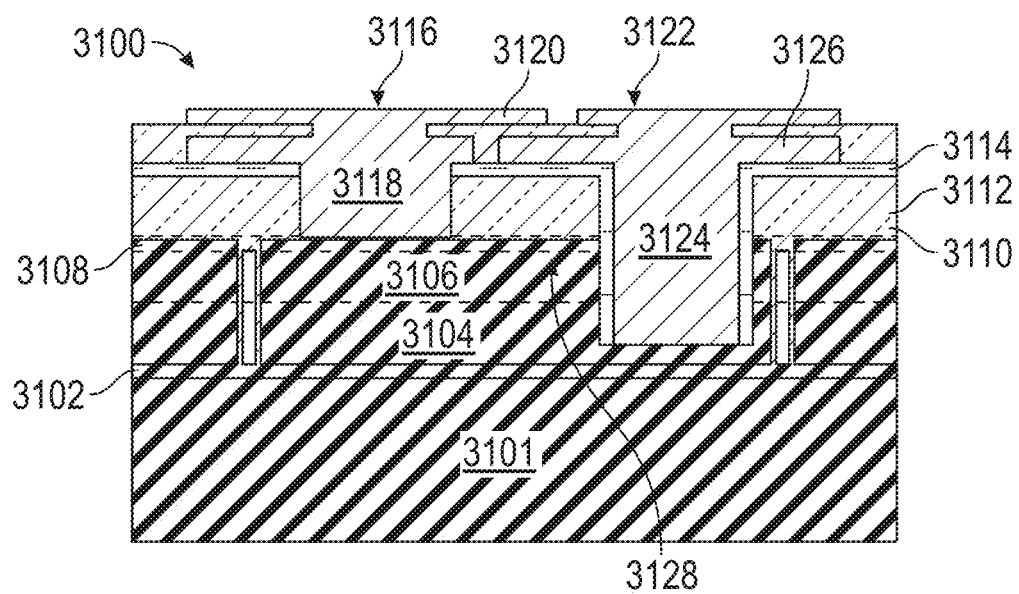
FIG. 31 depicts a shielded P-I-N diode of a functional chip carrier according to an exemplary embodiment.

FIG. 31 depicts a shielded P-I-N diode 3100 of a functional chip carrier according to an exemplary embodiment. The P-I-N diode 3100 has its junction shielded by overlying metal for minimum photosensitivity for such uses as voltage regulation and overvoltage protection. The diode 3100 includes a silicon substrate 3101, a BOX layer 3102, a p+ epi-Si layer 3104, an I epi-Si layer 3106, and an n+ epi-Si layer 3108. In one or more embodiments, the p+ epi-Si layer 3104 is 2.0 μm thick, the I epi-Si layer 3106 is 1.8 μm thick, and the n+ epi-Si layer 3108 is 0.2 μm thick. The diode 3100 also includes a sacrificial LTO layer 3110 and a pinch-off LTO layer 3112, as well as a CVD $Si_3N_4$ layer 3114. The diode 3100 includes an n+ contact (cathode) 3116, which has a main plug 3118 and wings 3120. The diode 3100 also includes a p+ contact (anode) 3122, which has a main plug 3124 and wings 3126. In one or more embodiments, the main plugs 3118, 3124 are 5 μm in diameter with the n+ main plug 3118 being 2.6 μm deep (below the CVD $Si_3N_4$ layer 3114) and the p+ main plug being 5.8+/−0.5 μm deep. More generally, in one or more embodiments each of the N+, I, P+ layers range from 0.1 um to 20 um. Since the I layer thickness is logarithmically proportional to the capture and conversion of photons into holes and electron, a thicker I layer will produce more current, for example, in the P-I-N diodes used as photovoltaic diodes. The N+ and P+ layer thickness can be optimized, where the lower thickness limit is dictated by the ability to serve as a good, low resistive ohmic contact for the cathode and anode metallization as well as satisfying the cathode and anode opening etch bias tolerance. At or slightly above the lower thickness, any added N+ and P+ thickness will add series resistance between the cathode and anode metal contact, and the I layer, and thereby will decrease photovoltaic P-I-N diode efficiency. The wings 3120, 3126 overlap to shadow the diode P-I-N junction 3128 between the main plugs 3118, 3124 so that the junction is exposed to minimal ambient light. As a result, the diode 3100 is not photosensitive.

Figure 32:
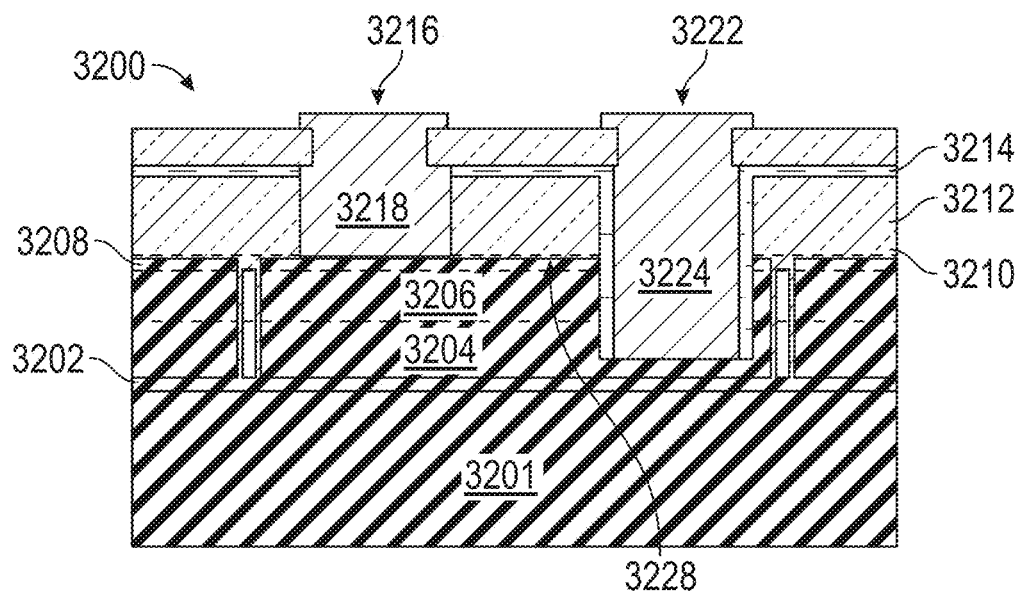
FIG. 32 depicts an unshielded P-I-N diode of a functional chip carrier according to an exemplary embodiment.

FIG. 32 depicts an unshielded P-I-N diode 3200 of a functional chip carrier according to an exemplary embodiment. The junction of the P-I-N diode 3200 is unshielded to provide the diode with photosensitivity, which can be utilized as a photodiode or as a photovoltaic cell. The diode 3200 includes a silicon substrate 3201, a BOX layer 3202, a p+ epi-Si layer 3204, an I epi-Si layer 3206, and an n+ epi-Si layer 3208. The diode 3200 also includes a sacrificial LTO layer 3210 and a pinch-off LTO layer 3212, as well as a CVD $Si_3N_4$ layer 3214. The diode 3200 includes an n+ contact (cathode) 3216, which has a main plug 3218. The diode 3200 also includes a p+ contact (anode) 3222, which has a main plug 3224. Between the main plugs 3218, 3224, metal over the diode P-I-N junction 3228 is reduced to maximize light collection. As a result, the diode 3200 is photosensitive.

In applications involving high frequency changes in light levels or optical communication, the photodiode uses the I epi-Si layer 3206 of intrinsic (undoped or lightly doped N−) semiconductor between the P and N layers to reduce the capacitance of the P-N junction and therefore improves the maximum switching speed. The comparatively deep intrinsic layer also provides a larger volume for photon to electron/hole conversion.

The P-I-N diode with photosensitivity can be also be utilized as photo-voltaic cells (PVs). Photovoltaic diodes have much larger area and corresponding junction capacitance than photodiodes in order to maximize the efficiency of light collection, but efficiency is not reduced from the larger junction capacitance as it is in the case of photodiodes since PVs are designed to produce (much greater) electric current at DC (0 Hz) and are not concern with capacitive effects on high frequency switching speed. Metal area over the active photovoltaic area (junction) is reduced to maximize photon collection and subsequent conversion to electron and hole carriers.

FIG. 33 depicts a shielded P-N diode 3150 of a functional chip carrier according to an exemplary embodiment. The diode 3150 includes a silicon substrate 3101, a BOX layer 3102, a p+ epi-Si layer 3104, an I epi-Si layer 3106, and an n+ epi-Si layer 3108. The diode 3150 also includes a sacrificial LTO layer 3110 and a pinch-off LTO layer 3112, as well as a CVD $Si_3N_4$ layer 3114. The diode 3150 includes a first n+ contact (cathode) 3152, formed in a first island of the stack, and includes a second n+ contact (first bridge contact) 3158, also formed in the first island of the stack. The n+ contacts terminate in the n+ epi-Si layer 3108. The cathode 3152 has a main plug 3154 and wings 3156, and the first bridge contact 3158 has a main plug 3160 and wings 3162. The diode 3150 also includes a first p+ contact (second bridge contact) 3164 that is formed in a second island of the stack, and includes a second p+ contact (anode) 3170, also formed in the second island of the stack. The p+ contacts terminate in the p+ epi-Si layer 3104. The second bridge contact 3164 has a main plug 3166 and wings 3168, and the anode 3170 has a main plug 3172 and wings 3174. The diode 3150 also includes a via bar (bridge) 3176, which electrically connects the first and second bridge contacts 3158, 3164 to short across the intrinsic silicon layer 3106 between the two islands of the stack. The bridge 3176 and the contacts 3158, 3164 thereby form a junction between the n+ epi-Si layer of the first island and the p+ epi-Si layer of the second island. Thus, the diode 3150 is effectively a P-(metal)-N diode that has characteristics of a conventional P-N diode while being formed on two P-I-N stacks. Advantageously, the P-(metal)-N diode 3150 can be formed during the same fabrication steps and in the same layers as a conventional P-I-N diode.

FIG. 34 depicts an unshielded P-N diode 3250 of a functional chip carrier according to an exemplary embodiment. The unshielded P-N diode 3250 has photosensitivity, therefore can be utilized as a photodiode or as a photovoltaic cell. The diode 3250 includes a silicon substrate 3201, a BOX layer 3202, a p+ epi-Si layer 3204, an I epi-Si layer 3206, and an n+ epi-Si layer 3208. The diode 3250 also includes a sacrificial LTO layer 3210 and a pinch-off LTO layer 3212, as well as a CVD $Si_3N_4$ layer 3214. The diode 3250 includes a first n+ contact (cathode) 3252 which is formed in a first island of the stack, and also includes a second n+ contact (first bridge contact) 3258, which also is formed in the first island. The cathode 3252 has a main plug 3254 and the first bridge contact 1858 has a main plug 3260. The diode 3250 also includes a first p+ contact (second bridge contact) 3264, which is formed in a second island of the stack, and includes a second p+ contact (anode) 3270, which also is formed in the second island. The second bridge contact 3264 has a main plug 3266 and the anode 3270 has a main plug 3272. The diode 3250 also includes a via bar (bridge) 3276, which electrically connects the first and second bridge contacts 3258, 3264 to short across the intrinsic silicon layer 3206 between the two islands of the stack and form a metal junction between the n+ epi-Si layer of the first stack and the p+ epi-Si layer of the second stack. Thus, the diode 3250 is effectively a P-(metal)-N diode that has characteristics of a conventional P-N diode while being formed on two P-I-N stacks. Advantageously, the P-(metal)-N diode 3250 can be formed with the same fabrication steps and in the same layers as a conventional P-I-N diode. Because the diode 3250 does not have wings that cover the junctions of the diode, the diode 3250 is photosensitive.

Figure 35:
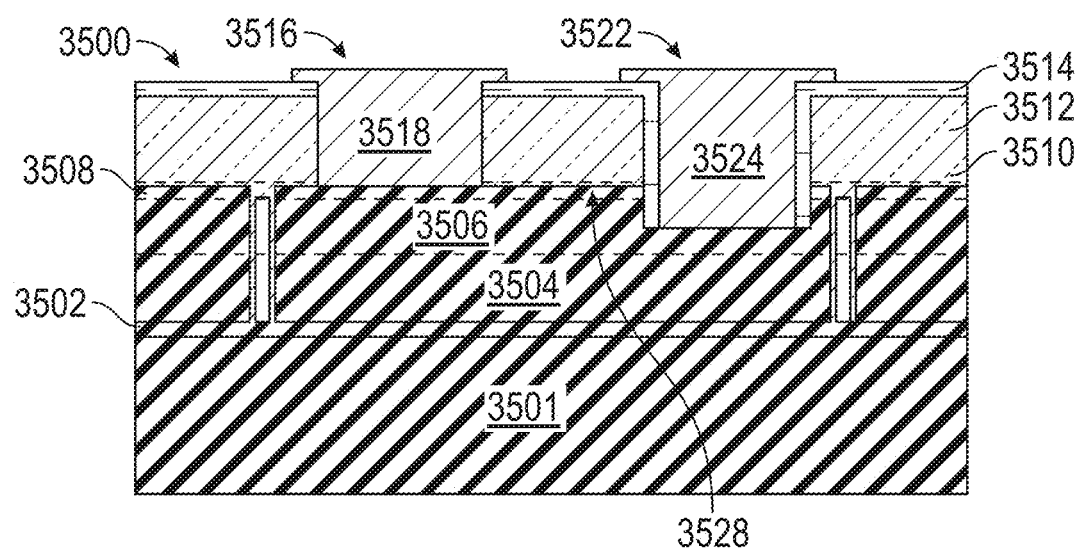
FIG. 35 depicts a Schottky diode of a functional chip carrier according to an exemplary embodiment.

FIG. 35 depicts a Schottky diode 3500 (also called a Hot Carrier Diode or Schottky Barrier Diode) of a functional chip carrier according to an exemplary embodiment. The Schottky diode 3500 uses a metal/semiconductor junction 3528 instead of a P semiconductor/N semiconductor junction. The Schottky diode 3500 has a substrate 3501 on which a buried oxide (BOX) layer 3502 is deposited. A p+ epi-Si layer 3504, an n−/intrinsic epi-Si layer 3506, and an n+ epi-Si layer 3508 are laid down on top of the BOX layer 3502. The Schottky diode 3500 also includes a sacrificial LTO layer 3510 and a pinch-off LTO layer 3512, as well as a CVD $Si_3N_4$ layer 3514. The Schottky diode 3500 has a metal cathode contact 3516 with a main plug 3518 that ends in the heavily doped n+ epi-Si layer 3508 and has a metal anode contact 3522 with a main plug 3524 that ends in the intrinsic metal or lightly doped N− silicon region 3506. The metal anode 3522 uses gold, silver, platinum, tungsten, molybdenum, chromium, etc. A low junction potential between the metal and the adjoining silicon, about 0.15V to 0.3V, makes the Schottky diode 3500 very suitable for RF applications in mixers, modulator and demodulator stages as well as power regulators. The diode has a very fast reverse recovery time since there are no minority carriers, lending to high frequency operation (Gigahertz to Terahertz). Note that Intrinsic silicon has a very low level of dopant, thus for all practical purposes, it can be N-. Advantageously, in one or more embodiments the Schottky diode 3500 can be fabricated in the same layers and during the same processing steps as the P-I-N diodes 3100, 3200 and the P-N diodes 3150, 3250.

Given the discussion thus far, and with reference to the accompanying drawings, it will be appreciated that, in general terms, an exemplary method, according to an aspect of the invention, includes attaching a smart chip 502 to a carrier 564 and attaching a memory chip 520 to the carrier and connecting the memory chip in communication with the smart chip. The memory chip 520 has a larger footprint than the smart chip 502, overlies the smart chip, and is attached to the carrier 564 by connections 580 around the periphery of the smart chip. In one or more embodiments, the method also includes attaching a lid 574 to the carrier 564 so that the lid covers the memory chip and the smart chip. In one or more embodiments, the method also includes attaching a light emitting diode 514 to the carrier 564 and connecting the light emitting diode in communication with the smart chip 502. In one or more embodiments, the method also includes connecting a photodiode 512 of the carrier 564 in communication with the smart chip 502. In one or more embodiments, the method also includes connecting an antenna 516 of the carrier 564 in communication with the smart chip 502. In one or more embodiments, the method also includes removably attaching an energy storage device 982 to the carrier 964 via a flex bridge 984 that electrically connects the energy storage device to the carrier. In one or more embodiments, the method also includes encapsulating the memory chip 1920 and the smart chip 1902 under a glob top 1974.

According to another aspect, an exemplary tetherless apparatus 500 includes a carrier 564; a smart chip 502 that is attached to the carrier; and a memory chip 520 that is attached to the carrier and is connected in communication with the smart chip. The memory chip 520 has a larger footprint than the smart chip 502, overlies the smart chip, and is attached to the carrier 564 by connections 580 around the periphery of the smart chip. In one or more embodiments, the apparatus also includes a lid 574 that is attached to the carrier 564 and encloses the memory chip 520 and the smart chip 502. In one or more embodiments, the apparatus also includes a photodiode 513 that is formed in the carrier and is connected in communication with the smart chip via the carrier. In one or more embodiments, the apparatus also includes a light emitting diode 514 that is attached to the carrier 564 and is connected in communication with the smart chip 502 via the carrier. In one or more embodiments, the apparatus also includes a glob top 1974 that encapsulates the memory chip 1920 and the smart chip 1902 onto the carrier 1964. In one or more embodiments, the apparatus also includes an antenna 516 that is formed in the carrier 564 and is connected in communication with the smart chip 502 via the carrier. In one or more embodiments, the apparatus also includes an energy harvesting structure 512, formed in the carrier 564, that is electrically connected to the smart chip 502. In one or more embodiments, the energy harvesting structure 912 is electrically connected to an energy storage device 982 that is removably attached to the carrier 964.

According to another aspect, an exemplary tetherless apparatus 900 includes a carrier 964; a smart chip 902 that is attached to the carrier; a memory chip 920 that is attached to the carrier and is connected in communication with the smart chip, wherein the memory chip has a larger footprint than the smart chip, overlies the smart chip, and is attached to the carrier by connections 980 around the periphery of the smart chip; and an energy storage device 982 that is removably attached to the carrier and electrically connected to the carrier via a flex bridge 984. In one or more embodiments, the apparatus also includes a light emitting diode 914 that is attached to the carrier 964 and is connected in communication with the smart chip 902 via the carrier. In one or more embodiments, the apparatus also includes a photodiode 913 that is formed in the carrier 964 and is connected in communication with the smart chip 902 via the carrier. In one or more embodiments, the apparatus also includes an antenna 916 that is formed in the carrier 964 and is connected in communication with the smart chip 902 via the carrier. In one or more embodiments, the apparatus also includes an energy harvesting structure 912 that is formed in the carrier 964 and is electrically connected with the energy storage device 982 via the carrier.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
attaching a smart chip to a carrier;
attaching a memory chip to the carrier and electrically connecting the memory chip in communication with the smart chip, wherein the memory chip has a larger footprint than the smart chip, overlies the smart chip, and is attached to the carrier by connections around the periphery of the smart chip;
attaching a voltage regulator to the carrier; and
forming an energy harvesting structure in the carrier and electrically connecting the energy harvesting structure to the smart chip via the voltage regulator.

2. The method of claim 1 further comprising:
attaching a lid to the carrier, wherein the lid covers the memory chip and the smart chip.

3. The method of claim 1 further comprising:
attaching a light emitting diode to the carrier and electrically connecting the light emitting diode in communication with the smart chip.

4. The method of claim 3 further comprising:
electrically connecting a photodiode of the carrier in communication with the smart chip.

5. The method of claim 1 further comprising:
electrically connecting an antenna of the carrier in communication with the smart chip.

6. The method of claim 1 further comprising:
removably attaching an energy storage device to the carrier via a flex bridge that electrically connects the energy storage device to the carrier.

7. The method of claim 1 further comprising:
encapsulating the memory chip and the smart chip under a glob top.

8. A tetherless apparatus comprising:
a carrier;
a smart chip that is attached to the carrier;
a memory chip that is attached to the carrier and is electrically connected in communication with the smart chip, wherein the memory chip has a larger footprint than the smart chip, overlies the smart chip, and is attached to the carrier by connections around the periphery of the smart chip;
a voltage regulator that is attached to the carrier;
an energy harvesting structure that is formed in the carrier and is electrically connected to the smart chip via the voltage regulator.

9. The apparatus of claim 8 further comprising:
a lid that is attached to the carrier and encloses the memory chip and the smart chip.

10. The apparatus of claim 8 further comprising:
a photodiode that is formed in the carrier and is electrically connected in communication with the smart chip via the carrier.

11. The apparatus of claim 10 further comprising:
a light emitting diode that is attached to the carrier and is electrically connected in communication with the smart chip via the carrier.

12. The apparatus of claim 8 further comprising:
a glob top that encapsulates the memory chip and the smart chip onto the carrier.

13. The apparatus of claim 8 further comprising:
an antenna that is formed in the carrier and is electrically connected in communication with the smart chip via the carrier.

14. The apparatus of claim 8 wherein the energy harvesting structure is electrically connected to an energy storage device that is removably attached to the carrier.

15. A tetherless apparatus comprising:
a carrier;
a smart chip that is attached to the carrier;
a memory chip that is attached to the carrier and is electrically connected in communication with the smart chip, wherein the memory chip has a larger footprint than the smart chip, overlies the smart chip, and is attached to the carrier by connections around the periphery of the smart chip;
a voltage regulator;
an energy harvesting structure that is formed in the carrier and is electrically connected to the smart chip via the voltage regulator; and
an energy storage device that is removably attached to the carrier and electrically connected to the carrier via a flex bridge.

16. The apparatus of claim 15 further comprising:
a light emitting diode that is attached to the carrier and is electrically connected in communication with the smart chip via the carrier.

17. The apparatus of claim 15 further comprising:
a photodiode that is formed in the carrier and is electrically connected in communication with the smart chip via the carrier.

18. The apparatus of claim 15 further comprising:
an antenna that is formed in the carrier and is electrically connected in communication with the smart chip via the carrier.

19. The apparatus of claim 15 wherein the energy harvesting structure is electrically connected with the energy storage device via the carrier.

\* \* \* \* \*